(12) United States Patent
Kobayashi et al.

(10) Patent No.: US 10,288,701 B2
(45) Date of Patent: May 14, 2019

(54) OPTICALLY PUMPED ATOMIC MAGNETOMETER AND MAGNETIC SENSING METHOD

(71) Applicant: CANON KABUSHIKI KAISHA, Tokyo (JP)

(72) Inventors: Tetsuo Kobayashi, Kyoto (JP); Yosuke Ito, Kyoto (JP); Sunao Ichihara, Kawasaki (JP); Natsuhiko Mizutani, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 721 days.

(21) Appl. No.: 14/822,246

(22) Filed: Aug. 10, 2015

(65) Prior Publication Data

US 2016/0061913 A1  Mar. 3, 2016

(30) Foreign Application Priority Data

Aug. 29, 2014 (JP) ................................. 2014-175881

(51) Int. Cl.
*G01R 33/26* (2006.01)

(52) U.S. Cl.
CPC .................................. *G01R 33/26* (2013.01)

(58) Field of Classification Search
CPC ..................................................... G01R 33/26
See application file for complete search history.

(56) References Cited

U.S. PATENT DOCUMENTS

| 4,715,708 A | 12/1987 | Ito |
| 4,999,513 A | 3/1991 | Ito et al. |
| 6,141,170 A | 10/2000 | Hatae et al. |
| 6,586,725 B2 | 7/2003 | Mizutani et al. |

(Continued)

FOREIGN PATENT DOCUMENTS

JP    2011-203133 A    10/2011

OTHER PUBLICATIONS

Yosuke Ito et al., "Magnetic Field Distribution Measurements With an Optically Pumped Atomic Magnetometer Using a Hybrid Cell of K and Rb Atoms for Biomagnetic Measurements", Mar. 2013, The Institute of Electronics, Information and Communication Engineers, vol. 112, No. 479, pp. 31-34.

*Primary Examiner* — Huy Q Phan
*Assistant Examiner* — Zannatul Ferdous
(74) *Attorney, Agent, or Firm* — Venable LLP

(57) ABSTRACT

Provided is an optically pumped atomic magnetometer that can separate and acquire magnetic information of spatially different places at the same time by one probe beam. The optically pumped atomic magnetometer includes a cell containing alkali metal atoms, a pump beam optical system introducing pump beams including circularly polarized light component to different locations of the cell, a probe beam optical system introducing a probe beam including linearly polarized light component to the cell, a detection unit detecting a signal reflecting a rotation angle of a plane of polarization of the probe beam after intersecting with the pump beams, and an information acquisition unit acquiring information related to a magnetic field intensity of each of the different locations from the detected signal. The pump beam optical system includes a modulation unit modulating the pump beams so that one of frequencies and phases of the pump beams is different.

14 Claims, 13 Drawing Sheets

(56) References Cited

U.S. PATENT DOCUMENTS

| | | |
|---|---|---|
| 6,603,557 B2 | 8/2003 | Mizutani |
| 6,785,003 B2 | 8/2004 | Mizutani et al. |
| 7,251,741 B2 | 7/2007 | Kobayashi et al. |
| 7,456,523 B2 | 11/2008 | Kobayashi |
| 8,941,377 B2 | 1/2015 | Mizutani et al. |
| 2009/0073544 A1* | 3/2009 | Schweitzer ............... G02F 1/11 359/305 |
| 2011/0193555 A1 | 8/2011 | Sugioka et al. |
| 2013/0127458 A1* | 5/2013 | Mizutani .............. G01R 33/022 324/301 |
| 2013/0278253 A1 | 10/2013 | Ichihara et al. |
| 2013/0328557 A1* | 12/2013 | Larsen ................... G01R 33/26 324/304 |
| 2014/0206981 A1 | 7/2014 | Nagasaka |
| 2015/0054504 A1* | 2/2015 | Ichihara ................. G01R 33/26 324/305 |
| 2015/0276865 A1* | 10/2015 | Nakamura ........... G01R 31/311 324/754.23 |

\* cited by examiner

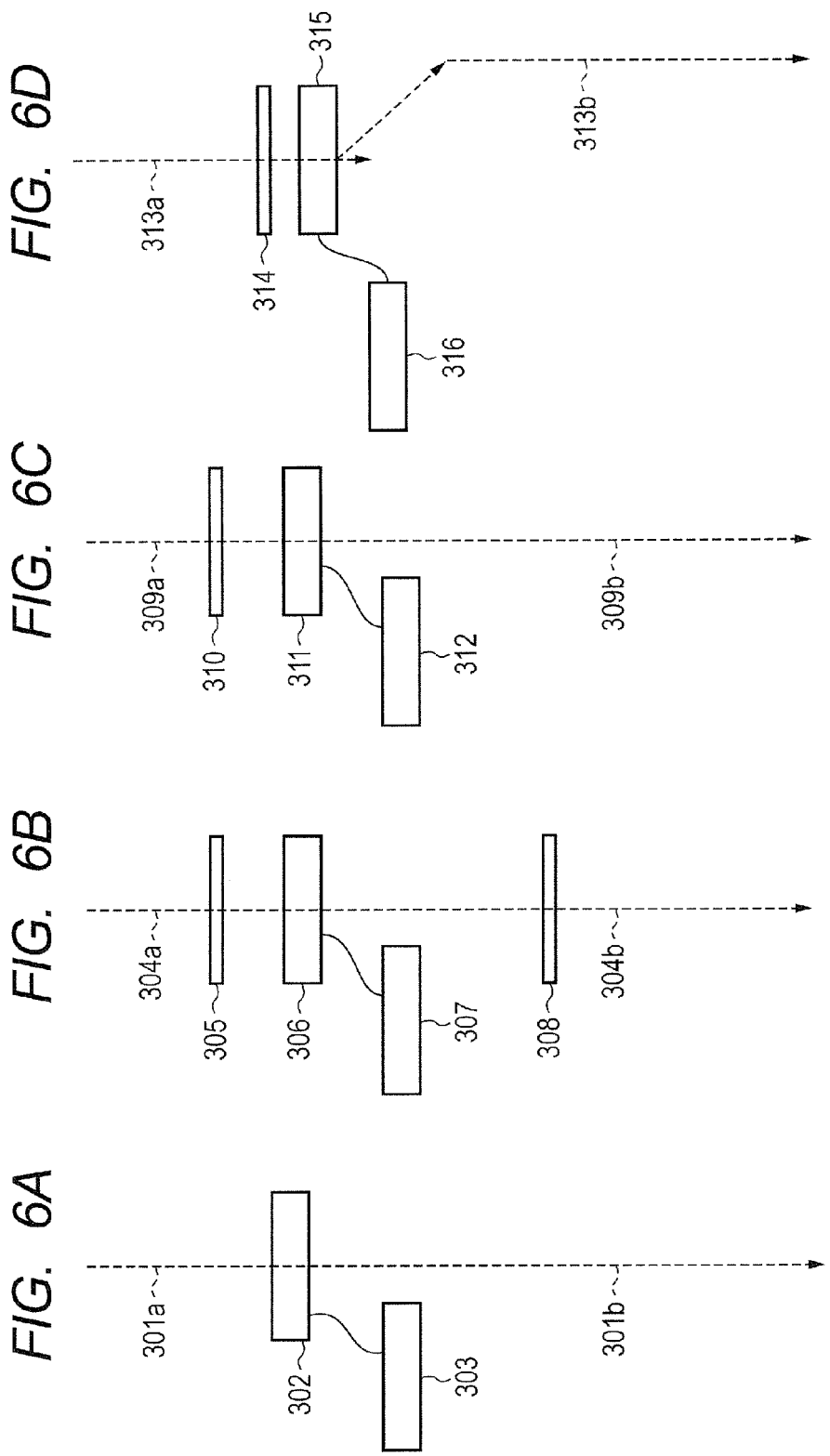

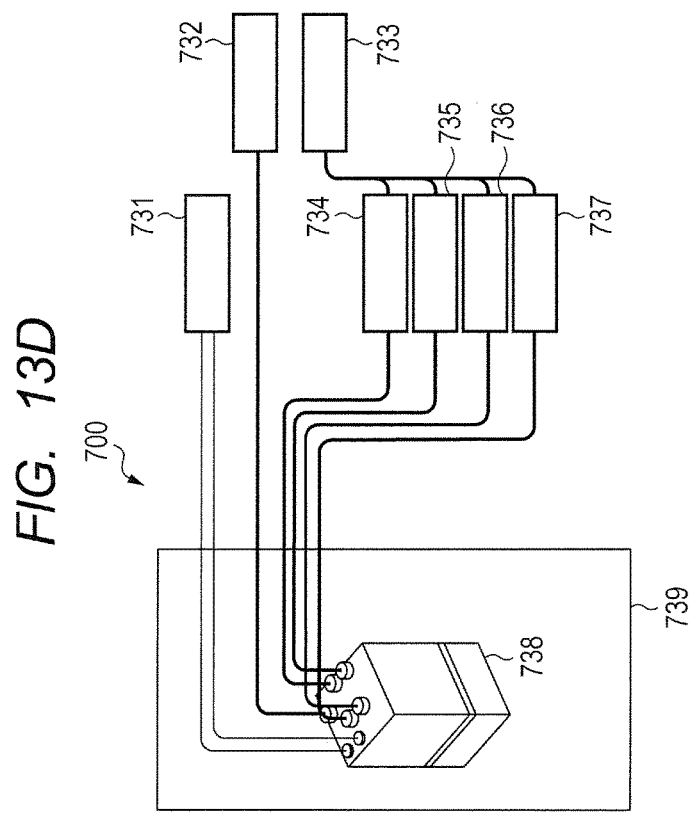
FIG. 13D
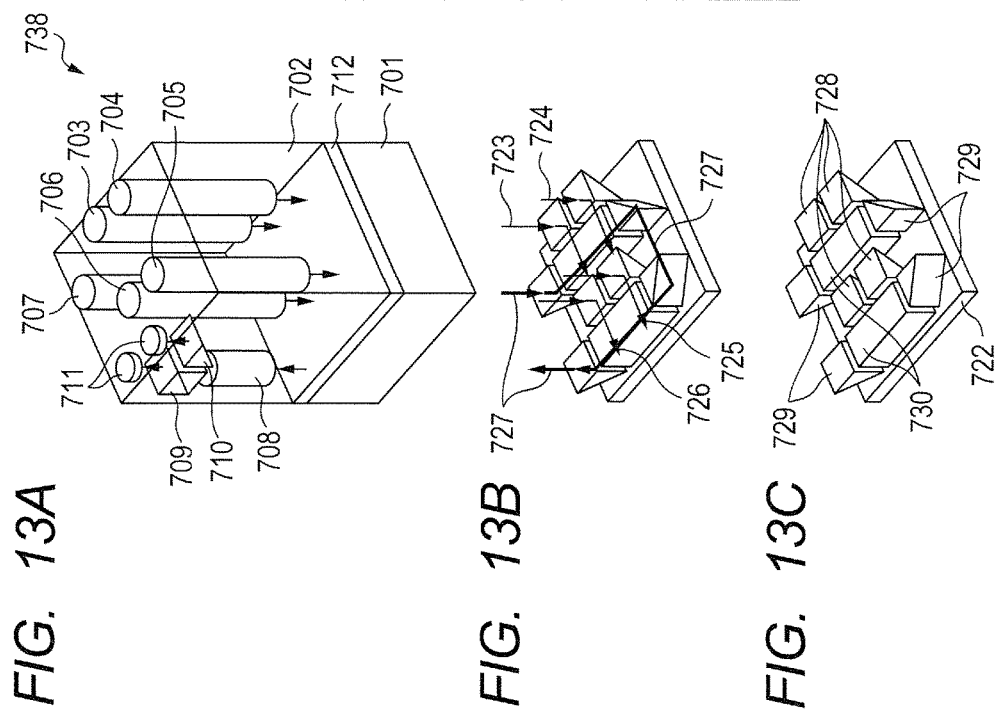
FIG. 13A
FIG. 13B
FIG. 13C

OPTICALLY PUMPED ATOMIC MAGNETOMETER AND MAGNETIC SENSING METHOD

BACKGROUND OF THE INVENTION

Field of the Invention

The present invention relates to a sensing method and a magnetometer that measure magnetic field intensity, and particularly, to an optically pumped atomic magnetometer and a magnetic sensing method using electron spin or nuclear spin of atoms.

Description of the Related Art

Optically pumped atomic magnetometers are described in Non Patent Literature 1 (Yosuke Ito, et al., "Magnetic field distribution measurements with an optically pumped atomic magnetometer using a hybrid cell of K and Rb atoms for biomagnetic measurements", IEICE, Vol. 112, No. 479, MBE 2012-93, p. 31, Mar. 2013) and Patent Literature 1 (Japanese Patent Application Laid-Open No. 2011-203133). The optically pumped atomic magnetometer described in Non Patent Literature 1 includes a cell containing alkali metal gas, a light source for pump beam (pump light, pump light beam) and a light source for probe beam (probe light, probe light beam). The optically pumped atomic magnetometer measures rotation of a plane of polarization of probe beam based on the spin polarization of an atom group rotated by a measurement target magnetic field and polarized by pump beam. Non Patent Literature 1 also illustrates a method of changing an intersection area of probe beam and pump beam in each measurement to separate and measure a magnetic signal of different locations on an optical path of the probe beam. Patent Literature 1 illustrates an example of a magnetic sensor array for emitting probe beam and pump beam to a plurality of cells or each cell.

The intersection area of the probe beam and the pump beam needs to be changed in the optically pumped atomic magnetometer of Non Patent Literature 1, and the magnetic field intensity of different locations on the optical path of the probe beam cannot be measured at the same time. The magnetic field intensity of different locations on the optical path of the probe beam cannot be measured in the optically pumped atomic magnetometer of Patent Literature 1. Furthermore, a detector of signal is necessary for each cell, and there is a problem that the size of the apparatus is increased.

Therefore, the optically pumped atomic magnetometers of Non Patent Literature 1 and Patent Literature 1 cannot separate and measure magnetic information of spatially different places on an optical path of probe beam at the same time by one probe beam.

SUMMARY OF THE INVENTION

An object of the present invention is to provide an optically pumped atomic magnetometer and a magnetic sensing method that can separate and measure magnetic information of spatially different places at the same time by one probe beam.

According to one aspect of the present invention, there is provided an optically pumped atomic magnetometer including one or a plurality of cells containing alkali metal atoms, a pump beam optical system that introduces a plurality of pump beams including a circularly polarized light component to different locations of the one or a plurality of cells, a probe beam optical system that introduces a probe beam including a linearly polarized light component to the cell so that the probe beam intersects with the plurality of pump beams entering the one or a plurality of cells at the different locations, a detection unit that detects a signal reflecting a rotation angle of a plane of polarization of the probe beam after intersecting with the plurality of pump beams, and an information acquisition unit that acquires information related to a magnetic field intensity of each of the different locations from the signal detected by the detection unit, wherein the pump beam optical system includes a modulation unit that modulates the plurality of pump beams so that at least one of frequencies and phases of the plurality of pump beams is different.

According to another aspect of the present invention, there is provided an optically pumped atomic magnetometer including a cell containing alkali metal atoms, a pump beam optical system that introduces pump beams including a circularly polarized light component to a plurality of parts of the cell at the same time, a probe beam optical system that introduces a probe beam including a linearly polarized light component to the cell so that the probe beam intersects with the pump beams entering the cell at the plurality of parts, a detector that detects a signal reflecting a rotation angle of a plane of polarization of the probe beam passing through the cell, and a calculation unit that calculates information related to magnetic field intensities of the plurality of parts from the signal detected by the detector, wherein the pump beams entering the plurality of parts are modulated at the same modulation frequency and different phases.

According to further another aspect of the present invention, there is provided an optically pumped atomic magnetometer including at least one cell containing alkali metal atoms, a pump beam optical system that introduces a pump beam including a circularly polarized light component to the cell, a probe beam optical system that introduces a probe beam including a linearly polarized light component to the cell so that the probe beam intersects with the pump beam at a plurality of different locations in the cell, a detection unit that detects the probe beam intersecting with the pump beam at the different locations to output a detection signal, an information acquisition unit that acquires information related to a magnetic field intensity of each of the different locations from the detection signal, and a modulation unit that modulates spin polarization rates of the alkali metal atoms at the different locations so that at least one of time-varying periods and phases of the spin polarization rates is different.

According to further another aspect of the present invention, there is provided a magnetic sensing method including inputting pump beams including a circularly polarized light component and in which at least one of frequencies and phases is different, to different locations of a cell containing alkali metal atoms, introducing a probe beam including a linearly polarized light component to the cell so that the probe beam intersects with the pump beams at the different locations, detecting a signal reflecting a rotation angle of a plane of polarization of the probe beam passing through the cell, and calculating information related to a magnetic field intensity at each of the different locations from the detected signal.

Further features of the present invention will become apparent from the following description of exemplary embodiments with reference to the attached drawings.

BRIEF DESCRIPTION OF THE DRAWINGS

FIGS. 6A, 6B, 6C and 6D are schematic diagrams illustrating an example of a modulation method of pump beam in the optically pumped atomic magnetometer according to the second embodiment of the present invention.

FIGS. 13A, 13B, 13C and 13D are schematic diagrams illustrating a configuration of an optically pumped atomic magnetometer according to an eighth embodiment of the present invention.

DESCRIPTION OF THE EMBODIMENTS

Preferred Embodiments of the present invention will now be described in detail in accordance with the accompanying drawings.

An optically pumped atomic magnetometer according to present embodiments includes one or a plurality of cells containing alkali metal atoms, and a pump beam optical system that introduces a plurality of pump beams including circularly polarized light components to different locations of the one or a plurality of cells. The optically pumped atomic magnetometer further includes a probe beam optical system that introduces a probe beam including linearly polarized light components to the cell so that the probe beam intersects with the plurality of pump beams entering the one or a plurality of cells at the different locations, and a detection unit that detects a signal reflecting a rotation angle of a plane of polarization of the probe beam after intersecting with the plurality of pump beams. The optically pumped atomic magnetometer further includes an information acquisition unit that acquires information related to a magnetic field intensity of each of the different locations from the signal detected by the detection unit. The pump beam optical system includes a modulation unit that modulates the plurality of pump beams so that at least one of frequencies and phases of the plurality of pump beams is different.

If the pump beams are modulated so that at least one of the frequencies and the phases of the plurality of pump beams emitted to the different locations on the optical path of the probe beam is different, a signal acquired by the information acquisition unit can be demodulated according to the modulation frequencies and the phases of the pump beams at the different locations to distinguish and detect the information related to the magnetic field intensity of the different locations.

The optically pumped atomic magnetometer according to the embodiments of the present invention will now be described in detail.

First Embodiment

An optically pumped atomic magnetometer and a magnetic sensing method according to a first embodiment of the present invention will be described with reference to FIGS. 1 to 4.

Figure 1:
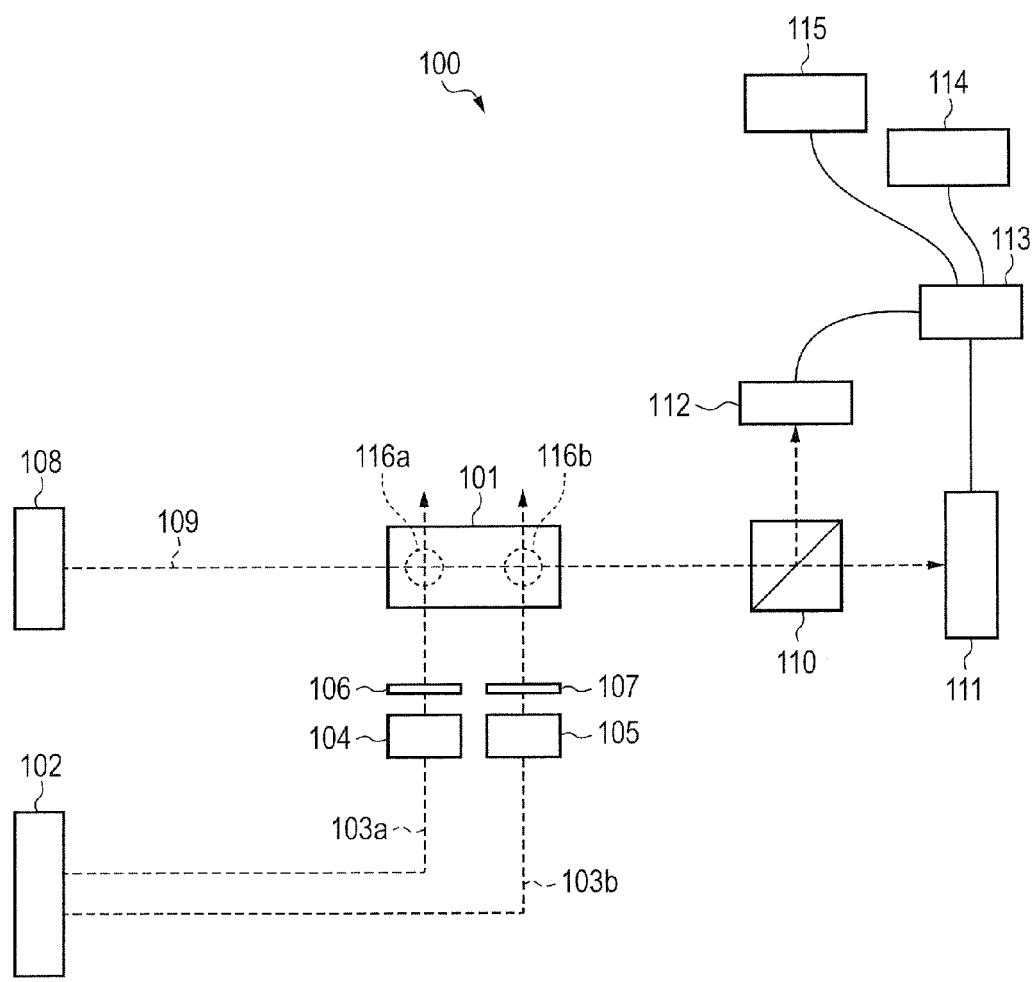
FIG. 1 is a schematic diagram illustrating a configuration of an optically pumped atomic magnetometer according to a first embodiment of the present invention.
Figure 2:
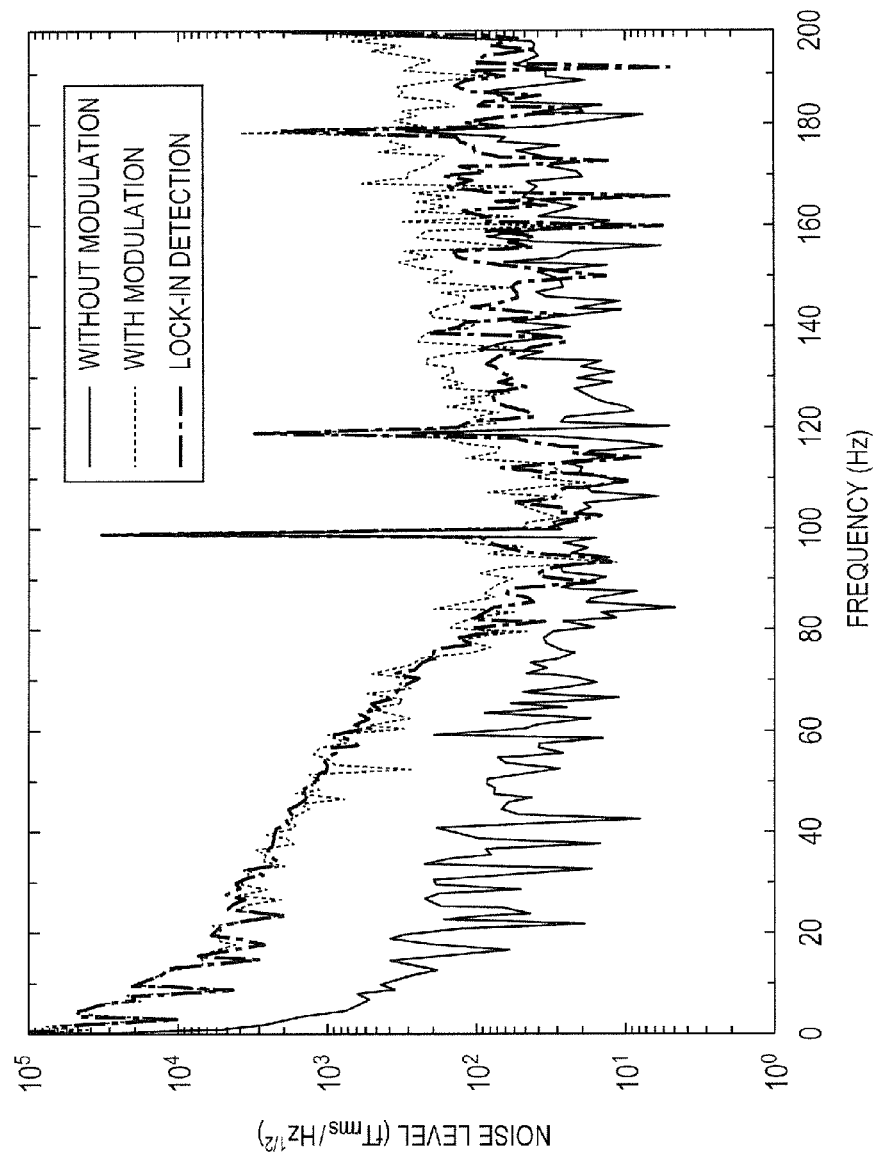
FIG. 2 is a diagram illustrating an example of a measurement result using the optically pumped atomic magnetometer according to the first embodiment of the present invention.
Figure 3:
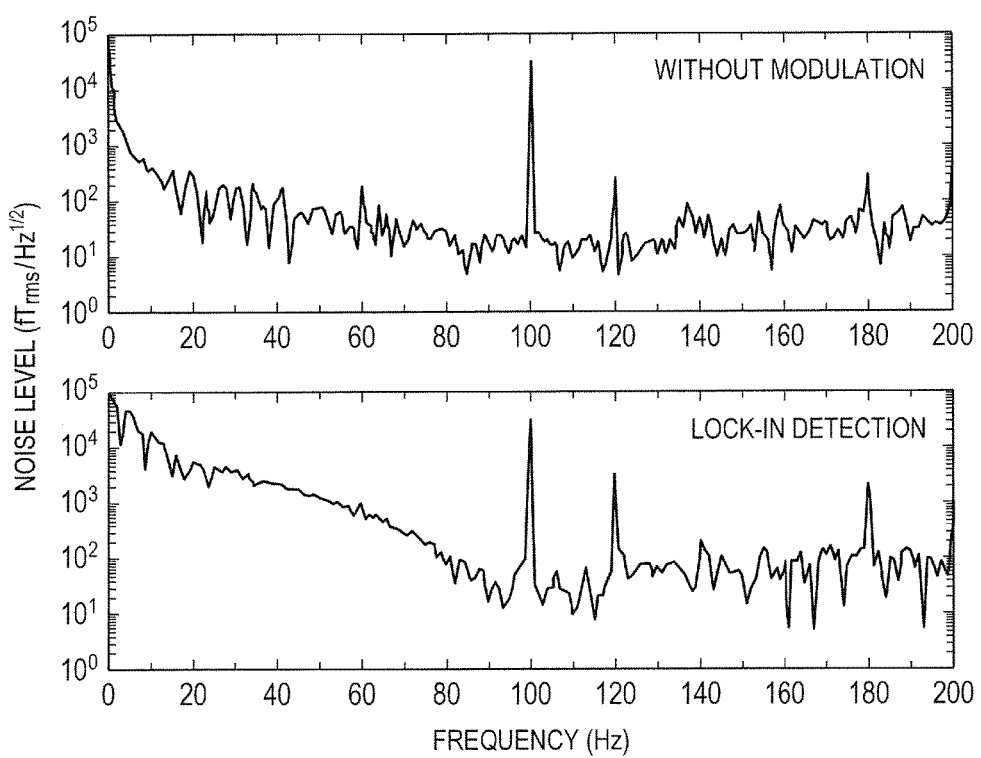
FIG. 3 is a diagram illustrating an example of a measurement result using the optically pumped atomic magnetometer according to the first embodiment of the present invention.
Figure 4:
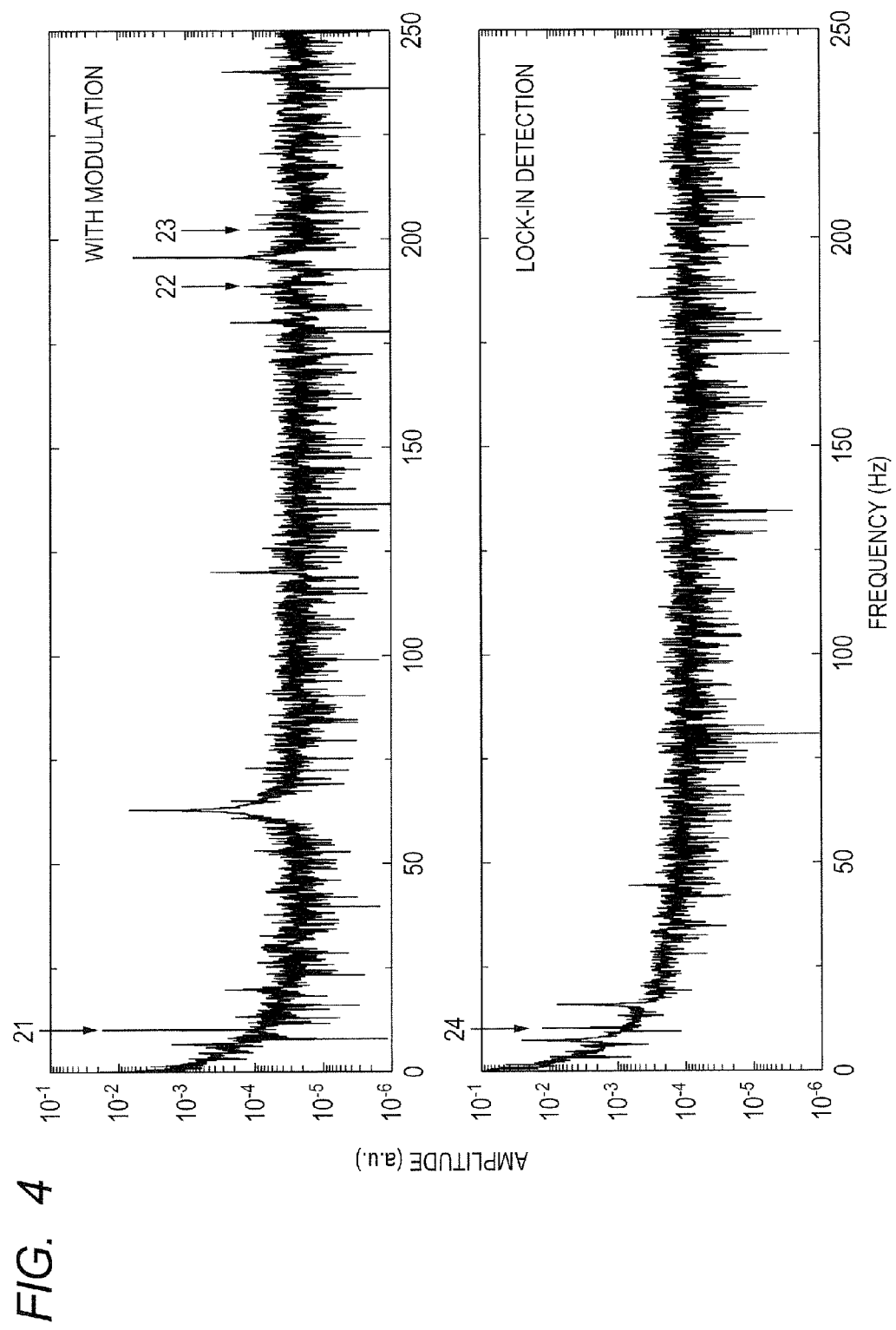
FIG. 4 is a diagram illustrating an example of a measurement result using the optically pumped atomic magnetometer according to the first embodiment of the present invention.

FIG. 1 is a schematic diagram illustrating a configuration of the optically pumped atomic magnetometer according to the present embodiment. FIGS. 2 to 4 are diagrams illustrating an example of results of measurement using the optically pumped atomic magnetometer according to the present embodiment.

First, a schematic configuration of the optically pumped atomic magnetometer according to the present embodiment will be described with reference to FIG. 1.

As illustrated in FIG. 1, an optically pumped atomic magnetometer 100 according to the present embodiment includes a cell 101, a pump beam optical system 102, optical modulators 104 and 105, phase retarders 106 and 107, and a probe beam optical system 108. The optically pumped atomic magnetometer 100 also includes a polarization separation element 110, photodetectors 111 and 112, a difference circuit 113 and demodulators 114 and 115. In the present specification, the pump beam optical system may denote a system including the optical modulators and the phase retarders.

The pump beam optical system 102 is configured to introduce a pump beam 103a to a measurement target area 116a of a cell 101 containing alkali metal atoms, such as potassium (K), through the optical modulator 104 and the phase retarder 106. The pump beam optical system 102 is also configured to introduce a pump beam 103b to a measurement target area 116b of the cell 101 through the optical modulator 105 and the phase retarder 107. The optical modulators 104 and 105 are a modulation unit that modulates the pump beams 103a and 103b.

The probe beam optical system 108 is configured to introduce the probe beam 109 to the cell 101. The measurement target areas 116a and 116b of the cell 101 are located on an optical path of the probe beam 109, and the probe beam 109 intersects with the pump beams 103a and 103b in the measurement target areas 116a and 116b, respectively.

The probe beam 109 that has passed through the measurement target areas 116a and 116b of the cell 101 enters the photodetectors 111 and 112 through the polarization separation element 110. The demodulators 114 and 115 are connected to the photodetectors 111 and 112 through the difference circuit 113. The polarization separation element 110 and the photodetectors 111 and 112 are a detector or a detection unit that detects a rotation angle of the probe beam 109 that passes through the cell 101. The difference circuit 113 and the demodulators 114 and 115 are a calculation unit that calculates information related to magnetic field intensities in the measurement target areas 116a and 116b from the rotation angle detected by the detection unit or an information acquisition unit that acquires the information. The demodulators 114 and 115 are a demodulation unit that performs demodulation at the same frequency as a modulation frequency used in the modulation unit.

Basic operation of the optically pumped atomic magnetometer according to the present embodiment will be described with reference to FIG. 1.

The pump beams 103a and 103b emitted from the pump beam optical system 102 are for performing spin polarization by making uniform the directions of the spin of the alkali metal atoms in the cell 101 by optical pumping. For this purpose, light wavelengths of the pump beams 103a and 103b are adjusted to a wavelength resonant with D1 transition of the alkali metal atoms (hereinafter, called "D1 transition resonance wavelength"). Light emitted from independent light sources may be used for the pump beams 103a and 103b, or light from a single light source may be separated and used.

The optical modulators 104 and 105 modulate the pump beams 103a and 103b at different frequencies. The frequencies of the pump beams 103a and 103b after the modulation can be frequencies that are not in a harmonic relationship. Examples of the modulation applied to the pump beams 103a and 103b by the optical modulators 104 and 105 include intensity modulation of the pump beams 103a and 103b, modulation of circular polarization degree, and modulation of light wavelength of pump beam.

The phase retarders 106 and 107 adjust the pump beams 103a and 103b modulated by the optical modulators 104 and 105 to beams with circularly polarized light components, and the beams enter the measurement target areas 116a and 116b of the cell 101, respectively.

The alkali metal atoms in the cell 101 are spin-polarized by the pump beams 103a and 103b entering the cell 101. The torque according to the measurement target magnetic field induces precession of the spin polarization of the atoms. The motion of the spin polarization is described by the following Bloch equation (Equation (1)).

$$\frac{d\vec{S}}{dt} = \frac{\gamma}{q}\vec{S}\times\vec{B} + \frac{R_{op}(t)}{q}\left(\frac{s}{2}\vec{z} - \vec{S}\right) - \frac{S_x\vec{x} + S_y\vec{y}}{T_2} - \frac{S_z\vec{z}}{T_1} \quad (1)$$

In Equation (1), S (=($S_x$, $S_y$, $S_z$)) represents the spin vector of the alkali metal atoms. γ represents the gyromagnetic ratio. q represents the slowdown factor. A vector B represents an external magnetic field. $R_{op}(t)$ represents the optical pumping rate. s represents a circular polarization degree of pump beam. $T_1$ represents a longitudinal relaxation time. $T_2$ represents a transverse relaxation time. Vectors x, y and z represent unit direction vectors. Here, a situation of inputting the pump beam from a z direction is considered.

The pumping rate is expressed by the following equation (Equation (2)).

$$R_{OP}(t) = sr_e cf \frac{I_{op}}{h\nu} \frac{\Delta\Gamma/2}{(\nu-\nu_0)^2 + (\Delta\Gamma/2)^2} \quad (2)$$

In Equation (2), $r_e$ represents a classical electron radius. c represents the velocity of light. f represents a transition intensity. $I_{op}$ represents an incident beam intensity. ΔΓ represents an absorption line width. h represents a Planck constant. ν represents a frequency of pump beam. $\nu_0$ represents a resonant frequency of alkali metal atoms.

In Equation (2), the optical pumping rate $R_{op}(t)$ can be changed by changing the circular polarization degree s, the incident beam intensity $I_{op}$ and the light frequency of the pump beam ν with respect to time t. A specific example of this includes a case in which the optical pumping rate $R_{op}(t)$ of the pump beam 103a that has passed through the phase retarder 106 temporally changes in a sine wave of a frequency $\omega_a$ as expressed by the following equation (Equation (3)).

$$R_{op}(t) = \frac{R_{op}}{2}(1+\cos(\omega_a t)) \quad (3)$$

With the optical pumping rate that temporarily changes as expressed by Equation (3), a spin polarization $S_z^a$ in a direction parallel to the pump beam 103a is calculated as a solution of Equation (1) in a situation in which the static magnetic field is only a magnetic field $B_z$ in the z direction. When the modulation frequency $\omega_a$ of the pump beam is sufficiently larger than the pumping rate $R_{op}$, second and higher order terms with respect to $R_{op}/2q\omega_a$ can be ignored in the developed equation. As a result, the following approximate equation (Equation (4)) can be obtained. Since the time t is sufficiently large in the actual measurement, an attenuation term not contributing to the measurement in Equation (4) is excluded, and only a constant term is described.

$$S_z^a(t) \cong \frac{sR_{op}}{\frac{4q}{T_1}+2R_{op}}\left(1+\frac{1}{T_1}\frac{\omega_a\sin(\omega_a t)+\left(\frac{1}{T_1}+\frac{R_{op}}{2q}\right)\cos(\omega_a t)}{\left(\frac{1}{T_1}+\frac{R_{op}}{2q}\right)^2+\omega_a^2}\right) \quad (4)$$

In this state, a minute magnetic field with an angular frequency ω in a y direction and a magnetic flux density $B_1$ is measured. Here, an amount $\Omega_1 = \gamma \times B_1/q$ is defined. The torque according to the measurement target magnetic field induces precession of the spin polarization of the atoms. Therefore, spin components $S_x^a(t)$ in an x direction can be measured to measure the magnetic field. For $S_x^a(t)$, up to the first order is obtained by using perturbation in relation to $\Omega_1$, and the attenuation terms are removed. The constant terms are expressed by the following equation (Equation (5)).

$$S_x^a(t) \cong -\frac{sR_{op}\Omega_1}{\frac{4q}{T_1}+2R_{op}}\left\{\frac{(\omega+\Omega_0)\sin(\omega t)+\left(\frac{1}{T_2}+\frac{R_{op}}{2q}\right)\sin(\omega t)}{\left(\frac{1}{T_2}+\frac{R_{op}}{2q}\right)^2+(\omega+\Omega_0)^2}+\right. \quad (5)$$

$$\left.\frac{(\omega-\Omega_0)\sin(\omega t)+\left(\frac{1}{T_2}+\frac{R_{op}}{2q}\right)\sin(\omega t)}{\left(\frac{1}{T_2}+\frac{R_{op}}{2q}\right)^2+(\omega-\Omega_0)^2}\right\} + \frac{sR_{op}^2\Omega_1}{4q\omega_a\left(\frac{4q}{T_1}+2R_{op}\right)}$$

$$\left\{\frac{(\omega-\Omega_0)\cos((\omega_a-\omega)t)+\left(\frac{1}{T_2}+\frac{R_{op}}{2q}\right)\sin((\omega_a-\omega)t)}{\left(\frac{1}{T_2}+\frac{R_{op}}{2q}\right)^2+(\omega-\Omega_0)^2}+\right.$$

-continued $$-(\omega - \Omega_0)\cos((\omega_a + \omega)t) + \left(\frac{1}{T_2} + \frac{R_{op}}{2q}\right)\sin((\omega_a + \omega)t)$$
$$\overline{\left(\frac{1}{T_2} + \frac{R_{op}}{2q}\right)^2 + (\omega - \Omega_0)^2} +$$

$$-(\omega + \Omega_0)\cos((\omega_a - \omega)t) - \left(\frac{1}{T_2} + \frac{R_{op}}{2q}\right)\sin((\omega_a - \omega)t)$$
$$\overline{\left(\frac{1}{T_2} + \frac{R_{op}}{2q}\right)^2 + (\omega + \Omega_0)^2} +$$

$$\frac{(\omega + \Omega_0)\cos((\omega_a + \omega)t) + \left(\frac{1}{T_2} + \frac{R_{op}}{2q}\right)\sin((\omega_a + \omega)t)}{\left(\frac{1}{T_2} + \frac{R_{op}}{2q}\right)^2 + (\omega + \Omega_0)^2}\right\}$$

Here, $\Omega_0$ $(=\gamma/q \times B_z)$ represents the Larmor frequency. The second term of Equation (5) indicates that the response of the spin polarization is modulated by the modulation frequency $\omega_a$.

Similarly, the response of spin polarization $S_x^b(t)$ when a modulation frequency $\omega_b$ is applied to the pump beam 103b is in a form replacing $\omega_a$ of Equation (4) with $\omega_b$.

The polarized light of the probe beam 109 emitted from the probe beam optical system 108 is a linearly polarized light. The plane of polarization of the probe beam 109 that has passed through the measurement area 116a receives paramagnetic Faraday rotations proportional to the spin polarization $S_x^a(t)$ in the measurement area 116a. The plane of polarization of the probe beam 109 that has passed through the measurement area 116b further receives paramagnetic Faraday rotations proportional to the spin polarization $S_x^b(t)$. As a result, the probe beam 109 that has passed through the cell 101 receives rotations of the plane of polarization in the size of the sum of the Faraday rotations from two parts, the measurement areas 116a and 116b.

Subsequently, the probe beam 109 enters the polarization separation element 110 and is divided into reflected beam and transmitted beam at an intensity according to the angle of the plane of polarization. The photodetector 111 detects the beam transmitted through the polarization separation element 110, and the photodetector 112 detects the beam reflected by the polarization separation element 110. The difference circuit 113 measures the difference between the beam intensities. The demodulators 114 and 115 demodulate the output at frequencies according to the modulation frequencies of the modulation units 104 and 105, respectively.

An output V(t) from the demodulator 114 when the demodulator 114 performs the demodulation at the angular frequency $\omega_a$ is expressed by the following equation (Equation (6)). Here, $V_a$ is a consolidation of constants of proportionality for the output of the circuit based on the size of the spin polarization obtained by consolidating the intensity of the probe beam, the absorption coefficients and the like.

$$V(t) \cong V_a \left\{ \frac{(\omega - \Omega_0)\sin(\omega t) + \left(\frac{1}{T_2} + \frac{R_{op}}{2q}\right)\cos(\omega t)}{\left(\frac{1}{T_2} + \frac{R_{op}}{2q}\right)^2 + (\omega - \Omega_0)^2} - \right.$$

$$\left. \frac{(\omega + \Omega_0)\sin(\omega t) + \left(\frac{1}{T_2} + \frac{R_{op}}{2q}\right)\cos(\omega t)}{\left(\frac{1}{T_2} + \frac{R_{op}}{2q}\right)^2 + (\omega + \Omega_0)^2} \right\}$$  (6)

FIG. 2 depicts a magnetic field spectrum ("without modulation" in FIG. 2) before the modulation obtained by an atomic magnetic sensor measuring a magnetic signal of 100 Hz, depicts a magnetic field spectrum ("with modulation" in FIG. 2) obtained by measuring the signal by applying intensity modulation at a modulation frequency of 1010 Hz to the pump beam by a chopper, and depicts a magnetic field spectrum ("lock-in detection" in FIG. 2) of the signal demodulated by a lock-in amplifier. K and Rb are enclosed at the same time in the cell, and the cell is heated to 180° C. by an electric heater. The densities of K and Rb in this case are about $10^{13}$ cm$^{-3}$ and $10^{14}$ cm$^{-3}$ respectively. The pump beam is set to the D1 transition resonance wavelength of K, and the probe beam is detuned a little from the D1 transition resonance wavelength of Rb to increase the signal response. The bias magnetic field is adjusted so that the sensor is resonant with 100 Hz. FIG. 3 is extraction of the magnetic field spectrum before the modulation ("without modulation" in FIG. 3) and the magnetic field spectrum after the demodulation ("lock-in detection" in FIG. 3) from FIG. 2 in a simplified manner. It can be recognized that the magnetic signal of 100 Hz is modulated by the intensity modulation of the pump beam, and this is demodulated by the lock-in amplifier. The magnetic field sensitivity around 100 Hz is 20.5 fT$_{rms}$/Hz$^{1/2}$ without modulation, 53.0 fT$_{rms}$/Hz$^{1/2}$ with modulation, and 37.1 fT$_{rms}$/Hz$^{1/2}$ with modulation and lock-in detection.

FIG. 4 illustrates a magnetic field spectrum when 196 Hz is selected for the modulation frequency, and 10 Hz is selected for the magnetic signal. The magnetic signal of 10 Hz (21 on the upper side of FIG. 4) is modulated to 186 Hz (22 on the upper side of FIG. 4) and 206 Hz (23 on the upper side of FIG. 4) by the intensity modulation of the pump beam. It can be recognized that on the lower side of FIG. 4, the signal is demodulated to 10 Hz (24 on the lower side of FIG. 4) by the lock-in amplifier.

When the difference between two modulation frequencies $\omega_a$ and $\omega_b$ is sufficiently large with respect to the frequency of the measurement magnetic field, the magnetic signal from the measurement area 116a and the magnetic signal from the measurement area 116b are sufficiently separated in the frequency area. Therefore, the demodulation by the demodulator 114 at the same frequency as the optical modulation unit 104 can measure the magnetic signal from the measurement area 116a. The demodulation by the demodulator 115 at the same frequency as the optical modulation unit 105 can measure the magnetic signal from the measurement area 116b. As a result, magnetic signals from spatially different places on the optical path of the probe beam 109 can be separated and measured.

According to the present embodiment, different modulations are applied to the pump beam entering different locations of the cell, and magnetic information at the different locations can be placed on the probe beam. As a result, magnetic information of spatially different places on the optical path of one probe beam can be separated and measured at the same time.

The number of cells may not be one, and a plurality of cells may be included. If the number of cells is one, a plurality of pump beams enters the cell. If a plurality of cells is included, the pump beam enters each of the plurality of cells, and furthermore, a plurality of pump beams may also enter each cell.

The present embodiment includes not only a case in which a plurality of pump beams is modulated at different frequencies, but also a case in which a plurality of pump beams is modulated at different phases. Although the frequency can be substantially the same when a plurality of pump beams is modulated at different phases, the frequency may be different if the magnetic field information at different locations can be distinguished.

Hereinafter, matters different from the first embodiment will be described in second to eighth embodiments and a modified embodiment, and the description of common matters will be omitted.

Second Embodiment

An optically pumped atomic magnetometer and a magnetic sensing method according to a second embodiment of the present invention will be described with reference to FIGS. 5 to 6D. The same constituent elements as in the optically pumped atomic magnetometer according to the first embodiment illustrated in FIGS. 1 to 4 are expressed by the same names, and the description will be omitted or simplified. The description of the same constituent elements in the embodiments can be applied to each other within a range not contrary to the configurations specific to the embodiments.

Figure 5:
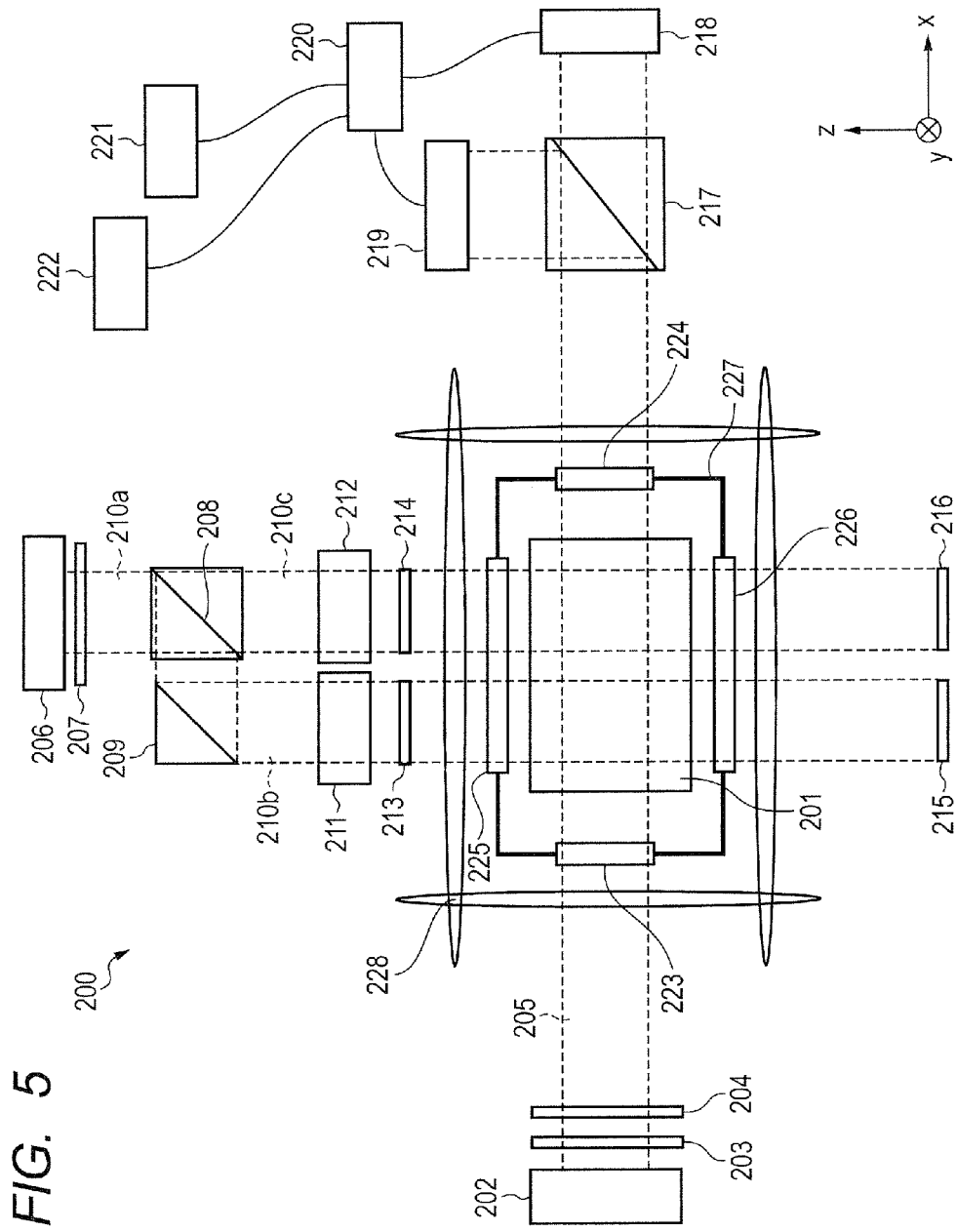
FIG. 5 is a schematic diagram illustrating a configuration of an optically pumped atomic magnetometer according to a second embodiment of the present invention.

FIG. 5 is a schematic diagram illustrating a configuration of the optically pumped atomic magnetometer according to the present embodiment. FIGS. 6A to 6D are schematic diagrams illustrating an example of a modulation method of pump beam.

First, a schematic configuration of the optically pumped atomic magnetometer according to the present embodiment will be described with reference to FIG. 5.

As illustrated in FIG. 5, an optically pumped atomic magnetometer 200 according to the present embodiment includes a cell 201, a thermostatic heat insulation tank 227 and bias magnetic field adjustment coils 228. The optically pumped atomic magnetometer 200 also includes a probe beam source 202, a linear polarizer 203 and a half wavelength plate 204. The optically pumped atomic magnetometer 200 also includes a pump beam source 206, a linear polarizer 207, a beam splitter 208, a mirror 209, optical modulators 211 and 212, quarter wavelength plates 213 and 214, and optical terminators 215 and 216. The optically pumped atomic magnetometer 200 also includes a polarization separation element 217, photodetectors 218 and 219, a difference circuit 220 and demodulators 221 and 222.

The cell 201 containing alkali metal atoms, such as potassium (K), is arranged in the thermostatic heat insulation tank 227. Optical windows 223, 224, 225 and 226 for introducing a probe beam 205 and pump beams 210b and 210c to the thermostatic heat insulation tank 227 are provided on the surfaces of the walls of the thermostatic heat insulation tank 227. The bias magnetic field adjustment coils 228 are arranged around the thermostatic heat insulation tank 227.

The probe beam source 202 is configured to introduce the probe beam 205 including linearly polarized light components to the cell 201 through the linear polarizer 203, the half wavelength plate 204 and the optical window 223. The probe beam 205 that has passed through the cell 201 enters the polarization separation element 217 through the optical window 224. These probe beam optical systems are arranged so that the probe beam 205 propagates in the cell 201 in the x direction of a coordinate system illustrated in FIG. 5.

The pump beam source 206 is configured to introduce the pump beams 210b and 210c to the cell 201 through the linear polarizer 207, the beam splitter 208, the mirror 209, the optical modulators 211 and 212, the quarter wavelength plates 213 and 214, and the optical window 225. The beam splitter 208 divides the pump beam 210a emitted from the pump beam source 206 and passed through the linear polarizer 207 into the pump beam 210b that is reflected beam and the pump beam 210c that is transmitted beam. The pump beam 210b is introduced to the thermostatic heat insulation tank 227 through the mirror 209, the optical modulator 211, the quarter wavelength plate 213 and the optical window 225, and the pump beam 210b enters the cell 201. The pump beam 210c is introduced to the thermostatic heat insulation tank 227 through the optical modulator 212, the quarter wavelength plate 214 and the optical window 225, and the pump beam 210c enters the cell 201.

As a result, the pump beams 210b and 210c with circularly polarized light components enter different locations of the cell 201. The pump beams 210b and 210c entering the cell 201 intersect with the pump beam 205 at different locations in the cell 201.

The pump beams 210b and 210c that have passed through the cell 201 enter the optical terminators 215 and 216 through the optical window 226, respectively. These pump beam optical systems are arranged so that the pump beams 210b and 210c propagate in the cell 201 in a −z direction of the coordinate system illustrated in FIG. 5.

The polarization separation element 217 divides the probe beam 205 entering the polarization separation element 217 into reflected beam and transmitted beam at an intensity according to the angle of the plane of polarization. The transmitted beam of the polarization separation element 217 enters the photodetector 218, and the reflected beam of the polarization separation element 217 enters the photodetector 219. The demodulators 221 and 222 are connected to the photodetectors 218 and 219 through the difference circuit 220.

The constituent parts of the optically pumped atomic magnetometer 200 according to the present embodiment will be more specifically described.

[1] Cell 201

The cell 201 is an airtight structure made of a material, such as glass, transparent to the probe beam and the pump beam. Potassium (K) as alkali metal atoms is enclosed in the cell 201. Other than potassium, examples of the alkali metal atoms that can be used for the cell 201 include rubidium (Rb) and cesium (Cs). The alkali metal atoms enclosed in the cell 201 may not be one type, and at least one type of atoms selected from the group consisting of potassium, rubidium and cesium can be included.

A buffer gas and a quencher gas are further enclosed in the cell 201. An example of the buffer gas includes a helium (He) gas. The helium gas has an effect of reducing diffusion of polarized alkali metal atoms and is effective for increasing the polarization rate by suppressing spin relaxation caused by collision with a cell wall. An example of the quencher gas includes a nitrogen ($N_2$) gas. The nitrogen gas is a quencher gas for reducing fluorescence by taking away energy from potassium atoms in an excited state and is effective for increasing the efficiency of optical pumping.

The scattering cross section of the potassium atoms with respect to spin polarization destruction caused by collision of the atoms and collision with helium atoms is the smallest among the alkali metal atoms. The scattering cross section of the rubidium atoms with respect to the spin polarization destruction is the smallest after the potassium atoms. Therefore, potassium can be the alkali metal atoms for constructing a magnetic sensor with a long relaxation time and a large magnetic field signal response.

Meanwhile, vapor pressures of rubidium and cesium are higher than that of potassium under the same temperature, and rubidium and cesium have an advantage of obtaining the same atom density at a lower temperature than potassium. Therefore, using rubidium atoms and cesium atoms is also effective from the viewpoint of constructing a sensor that operates at a lower temperature.

In the cell 201, a plate for physically separating measurement areas where the pump beams 210b and 210c and the probe beam 205 intersect in the cell may be provided between the measurement areas in order to prevent mixing of spin polarization through diffusion of spin-polarized atoms and spin exchange collision. The plate can be transparent, such as glass, to transmit the probe beam, and holes for the buffer gas to pass through may be provided at parts other than the parts where the probe beam passes through.

[2] Thermostatic Heat Insulation Tank 227

The cell 201 is installed in the thermostatic heat insulation tank 227. At the measurement, the cell 201 is heated to a temperature of up to about 200° C. in order to increase the density of the alkali metal gas in the cell 201. The thermostatic heat insulation tank 227 plays a role of retaining the heat. In the thermostatic heat insulation tank 227, the optical windows 223 and 224 are installed on the optical path of the probe beam 205, and the optical windows 226 and 225 are installed on the optical paths of the pump beams 210b and 210c, thereby preventing the beam to pass through the thermostatic heat insulation tank 227.

An example of the heating system of the cell 201 includes a system of heating the cell 201 by pouring a heated inert gas into the thermostatic heat insulation tank 227 from the outside. Another example includes a system of applying a current to a heater arranged in the thermostatic heat insulation tank 227 to heat the cell 201. In this case, driving the heater by a current with a frequency more than twice as high as the modulation frequency of the pump beam is effective to prevent the magnetic field caused by the heater current from affecting the measurement signal. Another example includes an optical heating system, in which the cell 201 or a light absorption member arranged around the cell 201 absorbs light introduced from the outside of the thermostatic heat insulation tank 227 to thereby heat the cell 201.

[3] Bias Magnetic Field Adjustment Coil 228

As illustrated in FIG. 5, the bias magnetic field adjustment coils 228 are arranged around the thermostatic heat insulation tank 227. The bias magnetic field adjustment coils 228 are installed in a magnetic shield not illustrated. The magnetic shield is arranged to reduce the magnetic field entering from the external environment.

The bias magnetic field adjustment coils 228 are used to operate the magnetic field environment around the cell 201. A specific example of the bias magnetic field adjustment coils 228 includes triaxial Helmholtz coils. Specifically, the bias magnetic field adjustment coils 228 apply a bias magnetic field in a direction (z direction in FIG. 5) parallel to the pump beam 210 so that the measurement frequency and the Larmor frequency coincide and resonate. The magnetic field in a direction (y direction in FIG. 5) orthogonal to the probe beam 205 and the pump beam 210 is then measured.

The bias magnetic field adjustment coils 228 for applying a magnetic field to the other directions (x direction and y direction in FIG. 5) are used for an environment, in which the residual magnetic field is cancelled, and the magnetic field is not applied. Shim coils may also be added to correct the inhomogeneity of the magnetic field.

[4] Probe Beam Optical System

As illustrated in FIG. 5, the probe beam optical system includes the probe beam source 202, the linear polarizer 203 and the half wavelength plate 204.

The light wavelength of the probe beam 205 emitted from the probe beam source 202 is detuned about several GHz to several dozen GHz from the D1 transition resonance wavelength of the potassium atoms in order to maximize the signal response. The value of detuning for maximizing the signal response depends on the buffer gas pressure and the temperature of the cell 201. The probe beam source 202 may include a stabilization unit, such as an external resonator, to stabilize the light wavelength. The linear polarizer 203 converts the probe beam 205 into linearly polarized light. As for the selection standard of the light wavelength, the detuning may be selected so as to maximize the SNR. With either standard, the optimal amount of detuning depends on the pump beam intensity in the cell. Therefore, it is also effective to periodically perform calibration during the measurement to correct the amount of detuning.

[5] Pump Beam Optical System

As illustrated in FIG. 5, the pump beam optical system includes the pump beam source 206, the linear polarizer 207, the beam splitter 208, the mirror 209, the optical modulators 211 and 212, the quarter wavelength plates 213 and 214, and the optical terminators 215 and 216.

The light wavelength of the pump beam 210a emitted from the pump beam source 206 is adjusted to the D1 transition resonance wavelength of potassium atoms. The pump beam source 206 includes a frequency stabilization unit that fixes the light wavelength of the pump beam 210a to the D1 transition resonance wavelength of potassium atoms. The linear polarizer 207 forms the pump beam 210a into a linearly polarized light, and then the beam splitter 208 divides the beam into the pump beam 210b and the pump beam 210c.

The optical modulators 211 and 212 modulate the pump beams 210b and 210c, respectively, and then the quarter wavelength plates 213 and 214 convert the pump beams 210b and 210c into circularly polarized light. In this case, the pump beam 210b and the pump beam 210c may be converted to either one of clockwise circularly polarized light and counterclockwise circularly polarized light. When the beams are converted into opposite circularly polarized light components, spin relaxation occurs due to the collision of the atoms spin-polarized by different polarized light. This can prevent mixing of spin polarization between measurement areas.

The circularly-polarized pump light beams 210b and 210c transmit through the optical window 225 and enter the cell 201 to polarize the potassium atom groups on the optical paths of the pump beams 210b and 210c in the cell 201, respectively. The pump beams 210b and 210c can enter different parts of the cell at the same time. The pump beam 210 that has transmitted through the cell 201 transmits through the optical window 226, and the optical terminators 215 and 216 execute a termination process.

The pump beam optical system may divide the pump beam 210a into three or more pump beams. In this case, the plurality of pump beams can enter a plurality of parts at the same time. Relaxation beam with the light wavelength adjusted to near the D1 transition resonance wavelength of potassium atoms may be provided between the pump beams. The emission of the relaxation beam between the pump beams promotes spin relaxation of potassium in the emission area, and this can prevent mixing of spin polarization between measurement areas through diffusion of potassium and spin exchange collision. Although the polarized light of the relaxation beam can be circularly polarized light, elliptically polarized light or unpolarized light, the polarized light can be linearly polarized light to efficiently promote spin relaxation by relaxation beam at a constant intensity.

[6] Optical Modulation System (Optical Modulators 213 and 214)

The optical modulators 213 and 214 modulate the pump beam 210b and the pump beam 210c at pumping rates. Spin polarization needs to be performed again by optical pumping before the spin polarization is destructed by longitudinal relaxation and transverse relaxation. Therefore, the modulation frequency in this case needs to be rather high. Longitudinal relaxation time $T_1$ of spin polarization is about up to 10 ms, and the modulation frequency can be 10 Hz or more. The modulation frequency can be 100 Hz or more and can further be 1 kHz or more.

As indicated by the coefficient of the second term of Equation (5), $$\frac{SR_{op}^2 \Omega_1}{4q\omega_a \left(\frac{4q}{T_1} + 2R_{op}\right)}$$

the response to the magnetic signal after the modulation is inversely proportional to the modulation frequency $\omega_a$. This indicates that the spin polarization does not follow if the modulation is performed at a frequency that is too high, and the signal response becomes weak.

The noise of the atomic magnetic sensor in principle includes spin projection noise and photon shot noise, and the noise levels of these do not change even if modulation is applied. Under typical experimental conditions (temperature 180° C., probe beam light wavelength 770.1 nm, probe beam power 0.1 mW, probe optical path length 5 cm and pump beam intensity 0.2 mW/cm²), the photon shot noise is dominant noise. When the photon shot noise is calculated from probe beam power, the modulation frequency with 10 $fT_{rms}/Hz^{1/2}$ in terms of magnetic field noise is about 5 kHz. Therefore, the modulation frequency can be 5 kHz or less.

Examples of the modulation method in the optical modulators 213 and 214 include pump beam intensity modulation, circular polarization degree modulation and wavelength modulation. Specific configurations of the optical modulators 213 and 214 will be described below with reference to FIGS. 6A to 6D.

[6.1] Pump Beam Intensity Modulation

An example of the pump beam intensity modulation includes a method using an optical chopper. The optical chopper periodically shields the beam, and the beam intensity of the beam passing through the optical chopper is modulated by a rectangular wave. More specifically, as illustrated in FIG. 6A, a pump beam 301a can be introduced to an optical chopper 302 to obtain a pump beam 301b in which the beam intensity is modulated in a rectangular wave shape. A signal generator 303 that controls the optical chopper 302 can control the modulation frequency of the optical chopper 302.

Another example of the pump beam intensity modulation includes a method using an electrooptical element. The electrooptical element utilizes a change in the birefringence of crystal by an electrooptical effect to change the state of the phase and polarization of the light. As illustrated in FIG. 6B, a pump beam 304a is input to a half wavelength plate 305, and the polarized light of the pump beam 304a is inclined 45° relative to the application direction of the electric field of an electrooptical element 306. The pump beam 304a that has passed through the half wavelength plate 305 passes through the electrooptical element 306, and the phase difference of the polarized light is modulated. This is the same as periodically changing the circular polarization degree of light. When the beam with modulated circular polarization degree passes through a linear polarizer 308, polarization components in directions different from the transmission axis direction of the linear polarizer 308 do not transmit. Therefore, the modulation of the circular polarization degree can be converted into intensity modulation. More specifically, a pump beam 304b with modulated beam intensity can be obtained. A signal generator 307 that controls the electric field applied to the electrooptical element 306 can control the modulation frequency of the electrooptical element 306.

Other than these methods, the pump beam intensity modulation can be a method of direct intensity modulation for modulating the drive current of a laser beam source, such as a DFB laser and a DBR laser. An electric optical modulator, such as an electroabsorption optical modulator, can also be used.

[6.2] Circular Polarization Degree Modulation

An example of the circular polarization degree modulation includes a method using an electrooptical element. As illustrated in FIG. 6C, a pump beam 309a is input to a half wavelength plate 310, and the polarized light is inclined 45° relative to the application direction of the electric field of the electrooptical element 311. The pump beam 309a that has passed through the half wavelength plate 310 passes through an electrooptical element 311, and the circular polarization degree of the polarized light is modulated. As a result, the polarized light of a pump beam 309b that has transmitted through the electrooptical element 311 periodically changes from linearly polarized light to circularly polarized light, and again to linearly polarize light. In this case, modulation with a large amplitude that reverses the circularly polarized light may be applied. A signal generator 312 that controls the electric field applied to the electrooptical element 311 can control the modulation frequency of the electrooptical element 311.

[6.3] Light Wavelength Modulation of Pump Beam

An example of the method of changing the light wavelength of the pump beam includes a method of using an acousto-optical element. As illustrated in FIG. 6D, when a pump beam 313a is introduced to an acousto-optical element 315, there is an optimal polarization angle. Therefore, a half wavelength plate 314 can adjust the polarization angle. When an RF oscillator 316 applies an electrical signal to the acousto-optical element 315, the pump beam 313a is diffracted into several orders, and the frequency changes. The acousto-optical element 315 spatially separates the pump beam 313a into N-th order diffracted beam with light frequency of $\omega_0 + N\omega_{RF}$, wherein $\omega_0$ represents the light frequency of the pump beam 313a before the introduction to the acousto-optical element 315, and $\omega_{RF}$ represents the frequency of the electrical signal applied by the RF oscillator 316. Here, N denotes an arbitrary integer. As a result, a light wavelength-modulated pump beam 313b can be obtained. In general, the amount of change in the frequency of the first-order diffracted beam is about several dozen MHz to several hundred MHz. To increase the intensity of the modulation signal, the amount of change in the frequency can be as large as about half width at half maximum of the absorption line width. In the case of a glass cell containing about 1 [amg] of helium buffer gas, the amount of change in the frequency can be about several GHz. Therefore, high-order diffracted beam needs to be selected. Here, [amg] denotes the size of the pressure measured at 0° C.

Other than this method, the light wavelength modulation of pump beam can also be performed by electric tuning of a laser beam source, such as a DFB laser and a DBR laser.

[7] Polarization Measurement System

As illustrated in FIG. 5, the polarization measurement system includes the polarization separation element 217, the photodetectors 218 and 219, the difference circuit 220 and the demodulators 221 and 222.

The probe beam 205 entering the polarization separation element 217 is divided into transmitted beam and reflected beam according to a polarization angle θ. As for the ratio of beam power, the intensity ratio of the transmitted beam and the reflected beam is $\cos^2 \theta : \sin^2 \theta$. This is based on a polarized state, in which all of the beam entering the polarization separation element 217 transmits and enters the photodetector 218, i.e. θ=0°. In this case, all of the beam at θ=90° is reflected and enters the photodetector 219.

The photodetectors 218 and 219 measure the power intensities of the beams divided into two, and the difference is output from the difference circuit 220. When the polarization of the probe beam 205 without a measurement target magnetic field is adjusted to θ=45°, beams with the same beam power enter the photodetectors 218 and 219 without a measurement target magnetic field, and the output from the difference circuit 220 is 0.

On the other hand, when there is a measurement target magnetic field, there is rotation of the plane of polarization according to the size of the measurement target magnetic field. Beams with different beam power enter the photodetectors 218 and 219, and a difference that is not 0 is output from the difference circuit 220. More specifically, the output from the difference circuit 220 is a signal proportional to the rotation angle of the plane of polarization of the probe beam, and the size of the measurement target magnetic field is reflected.

The output signal of the difference circuit 220 is input to the demodulators 221 and 222 and demodulated by the demodulators 221 and 222. An example of the demodulators 221 and 222 includes lock-in amplifiers. In this case, the demodulator 221 can demodulate the signal at the same frequency as the optical modulator 211 to extract a magnetic signal of an intersection area of the probe beam 205 and the pump beam 210b. The demodulator 222 can demodulate the signal at the same frequency as the optical modulator 212 to extract a magnetic signal of an intersection area of the probe beam 205 and the pump beam 210c.

Although an example of using two demodulators 221 and 222 to acquire magnetic signals of difference areas is illustrated here, the method of acquiring magnetic signals of different areas is not limited to this. For example, instead of preparing a plurality of demodulators, an A/D converter may import the output of the difference circuit 220 as a digital signal, and then digital signal processing may be executed. For the imported digital signal, data of predetermined spectrum spaces according to the modulation frequencies in the frequency areas can be filtered to separate the magnetic signals in the intersection areas.

A conductive thin plate, such as aluminum, can be arranged between the sensor and the signal source to increase the separation accuracy of the magnetic signal between the intersection areas. For example, the modulation frequencies of the pump beams 210b and 210c are $f_b$ [Hz] and $f_c$ [Hz], respectively, and the measurement frequency is $f_x$ [Hz]. In this case, the frequency spectrum of the output from the difference circuit 220 is a spectrum with four peaks, $f_b-f_x$ [Hz], $f_c+f_x$ [Hz], $f_c-f_x$ [Hz] and $f_c+f_x$ [Hz]. If the measurement frequency $f_x$ is not less than half the modulation frequency difference $(f_b-f_c)/2$ [Hz], $f_b+f_x$ is greater than $f_c-f_x$. A signal of frequency $f_c-f_b-f_x$ [Hz] is also output from the demodulator 221. This indicates that the signal from the intersection area created by the pump beam 210c enters the output from the demodulator 221 as noise. To prevent this mixing, a conductive thin plate, such as aluminum, can be arranged around the thermostatic heat insulation tank 227 to shield the frequency not less than (fb−fc)/2 [Hz]. In this way, a high-frequency magnetic signal is shielded, and the separation accuracy of the magnetic signal between the intersection areas increases. The shielding effect by the conductive material with respect to the magnetic field that changes with time is higher for high frequencies, indicating low-pass filter characteristics. The thickness of the conductive plate can be about the skin depth relative to the AC magnetic field at the cutoff frequency. When the difference between the modulation frequencies is 1 kHz, an aluminum plate with a thickness of 3 mm can be arranged to reduce the magnetic signal at not less than 500 Hz to 1/e (0.37), considering the RF shielding effect. In this way, the signal at not less than 500 Hz can be attenuated, while a biomagnetic signal at not more than 100 Hz is just slightly attenuated.

According to the present embodiment, the modulation frequencies of the pump beams entering different locations of the cell are changed, and magnetic information at the different locations can be placed on the probe beam. As a result, the magnetic information of spatially different places can be separated and measured at the same time by one probe beam.

Third Embodiment

An optically pumped atomic magnetometer and a magnetic sensing method according to a third embodiment of the present invention will be described with reference to FIG. 5 and FIGS. 7A to 7C. The same constituent elements as in the optically pumped atomic magnetometer according to the first and second embodiments illustrated in FIGS. 1 to 6D are expressed by the same names, and the description will be omitted or simplified. The description of the same constituent elements in the embodiments can be applied to each other within a range not contrary to the configurations specific to the embodiments.

First, a schematic configuration of the optically pumped atomic magnetometer according to the present embodiment will be described with reference to FIG. 5.

The optically pumped atomic magnetometer according to the present embodiment is the same as the optically pumped atomic magnetometer according to the second embodiment illustrated in FIG. 5, except that the demodulators 221 and 222 are not used. The other constituent parts can be the same as those of the optically pumped atomic magnetometer according to the second embodiment. The pump beam optical system operates in the same way as in the second embodiment, except for the cell 201, the thermostatic heat insulation tank 227, the bias magnetic field adjustment coils 228, the probe beam optical system and the optical modulators 211 and 212.

Figure 7A:
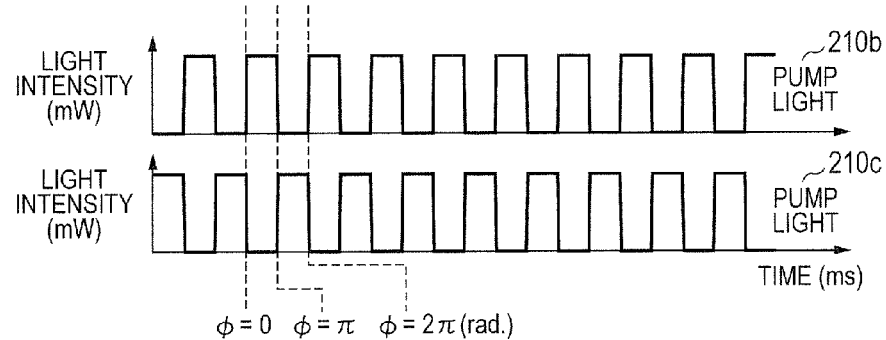
FIGS. 7A, 7B and 7C are diagrams illustrating an example of pump beam modulation in an optically pumped atomic magnetometer according to a third embodiment of the present invention.
Figure 7B:
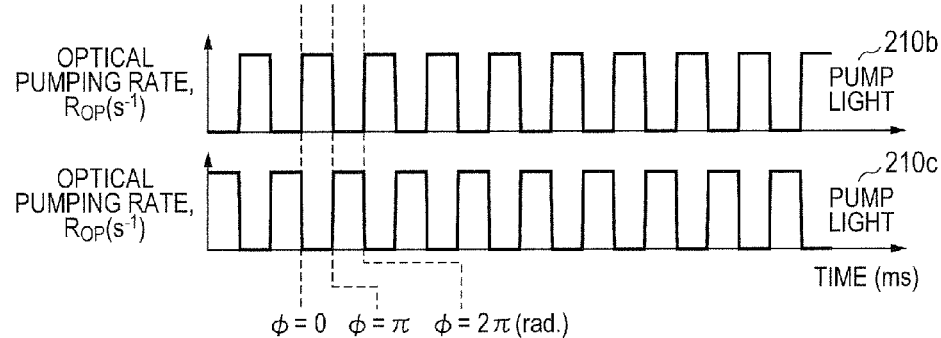
Figure 7C:
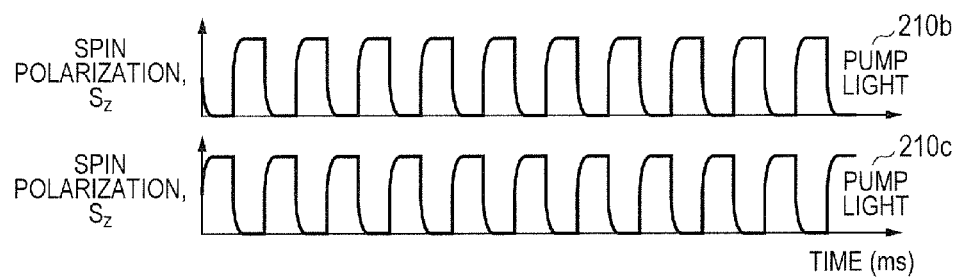

Operation of the optically pumped atomic magnetometer according to the present embodiment will be described with reference to FIG. 5 and FIGS. 7A to 7C. FIGS. 7A to 7C are diagrams illustrating an example of pump beam modulation in the optically pumped atomic magnetometer according to the present embodiment.

In the optically pumped atomic magnetometer according to the present embodiment, the frequencies of modulation applied to the pump beams 210b and 210c are the same, and the phases of modulation are different. The parts that can be carried out in the same way as in the second embodiment will not be described, and parts specific to this embodiment will be mainly described.

In the present embodiment, the optical modulators 211 and 212 apply the same frequency $f_{mod}$ of modulation to the pump beam 210b and 210c, and the phases of modulation are different. The modulation frequency $f_{mod}$ is selected so that the relationship between the modulation frequency $f_{mod}$ and the relaxation time $T_2$ of spin polarization is $T_2 \leq 1/(2\pi f_{mod})$. An example includes an alkali metal cell, in which the relaxation time $T_2$ is 1.5 ms when the modulation frequency $f_{mod}$ is 90 Hz. As described in the second embodiment, the longitudinal relaxation time $T_1$ of spin polarization is typically about 10 ms. To set the relaxation time $T_2$ to 1.5 ms in this cell, the enclosed amount of nitrogen in the quencher gas with a large collision cross-section is increased to reduce the relaxation time of spin polarization.

FIG. 7A illustrates the intensity modulation with different phases. The light intensity of the pump beam 210b is large when a phase ϕ is between 0 and π, and the light intensity is 0 when the phase ϕ is between π and 2π. The light intensity of the pump beam 210c is 0 when the phase ϕ is between 0 and π, and the light intensity is large when the phase ϕ is between π and 2π. The modulation of the light intensity is also modulation of the optical pumping rate as illustrated in FIG. 7B.

In this way, the pump beams 210b and 210c modulated at the same frequency and different phases are irradiated to different areas on the optical path of the probe beam 205. As a result, components $S_z$ of spin polarization in the pump beam direction in the areas of intersection of the pump beams 210b and 210c and the probe beam 205 are as illustrated in FIG. 7C. Therefore, the area applied with the pump beam 210b and the area applied with the pump beam 210c are subjected to complementary and periodical modulation. However, due to influence of the relaxation time, the time waveforms of the size of the spin polarization $S_z$ are moderate waveforms that are limited by finite rise time and fall time with respect to the rectangular waves of the pump beams 210b and 210c.

The spin polarization $S_z$ further rotates according to the magnetic field to be measured, and the components $S_x$ of spin polarization in the probe beam direction are generated. Therefore, the signal read by the probe beam 205 is a signal obtained by superimposing the modulated signals. The output obtained from the probe beam 205 through the polarization separation element 217, the photodetectors 218 and 219, and the difference circuit 220 is a signal proportional to the rotation angle of the plane of polarization of the probe beam 205, which is the same as in the second embodiment.

The magnetic field signals in the measurement areas can be separated by the following signal processing to the output from the difference circuit 220.

First, the A/D converter digitalizes the output from the difference circuit 220 as a time-series signal. The digital data is divided into two time-series data with reference to the phase in a reference modulation frequency. Missing parts of the time-series data are interpolated from previous and following data. Considering the sampling theorem, the reproduction of the signal is guaranteed by the interpolation if the signal band is limited to a frequency region lower than ½ of the modulation frequency. More smooth interpolation based on phase conditions is actually possible, because there is sampling data of a plurality of continuous points.

Although the spatial information of signals from different places on the optical path of one probe beam 205 is held in the modulation frequencies of signals in the second embodiment, the spatial information is held in the phases of modulated signals in the present embodiment. Examples of effective methods of the modulation include modulation of circular polarization degree and modulation of light wavelength of pump beam described in the second embodiment. Particularly, when the modulation of circular polarization degree is used in a rectangular wave shape, the pump beam of the linearly polarized light actively destructs the spin polarization within the range of the phase not pumped. This contributes to the reduction of the relaxation time, and the signal can be separated in steep waveforms. The beam of the linearly polarized light may be separately emitted as relaxation beam within the range of the phase not pumped. The reduction of the spin relaxation time can prevent mixing of spin polarization between two measurement areas through diffusion of potassium and spin exchange collision. In addition to the division with reference to the phase in relation to the signal separation, the noise can be further reduced by means of deconvolution based on relaxation characteristics and digital signal processing such as independent component analysis.

Although an example of using two pump beams for one probe beam is described in the present embodiment, the number of pump beams can be increased to three or four. When three pump beams are used to multiplex the measurements of three parts, the phase can be divided into three ranges, from 0 to 2π/3, from 2π/3 to 4π/3 and from 4π/3 to 2π. When four pump beams are used to multiplex the measurements of four parts, the phase can be divided into ranges of π/2.

According to the present embodiment, the pump beams entering different locations of the cell are modulated at the same modulation frequency and different phases. Therefore, the magnetic information in the different locations can be placed on the probe beam. As a result, the magnetic signal of spatially different places can be separated and measured at the same time by one probe beam.

Fourth Embodiment

An optically pumped atomic magnetometer and a magnetic sensing method according to a fourth embodiment of the present invention will be described with reference to FIGS. 8 and 9. The same constituent elements as in the optically pumped atomic magnetometer according to the first to third embodiments illustrated in FIGS. 1 to 7C are expressed by the same names, and the description will be omitted or simplified. The description of the same constituent elements in the embodiments can be applied to each other within a range not contrary to the configurations specific to the embodiments.

Figure 8:
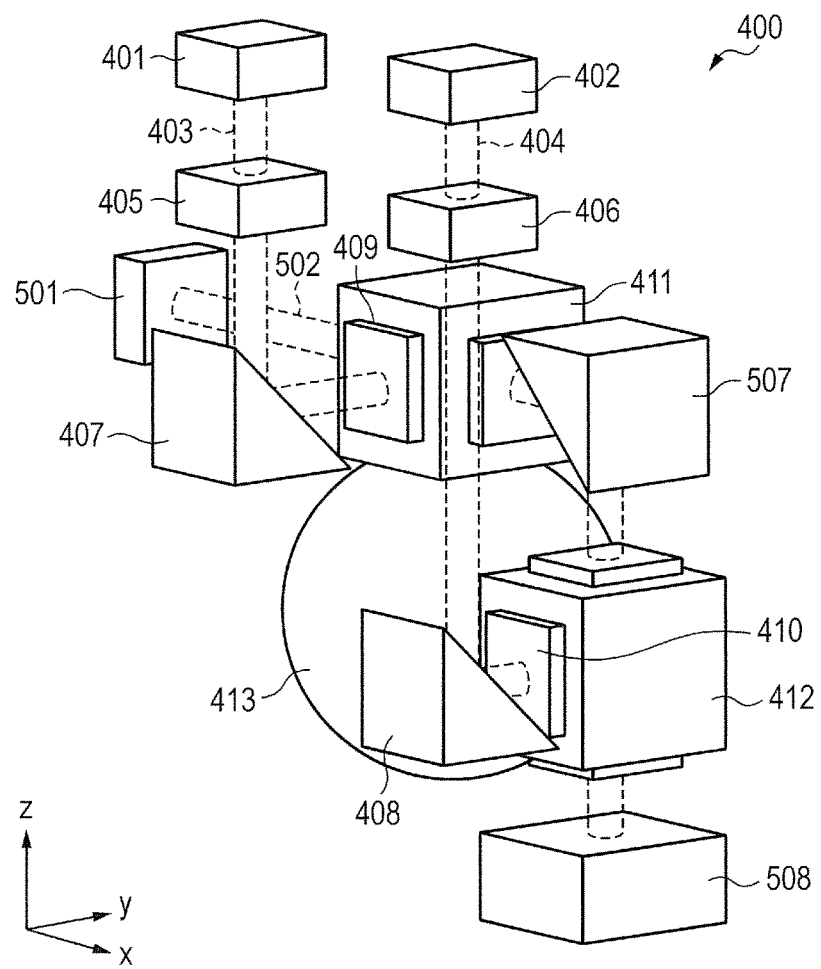
FIG. 8 is a perspective view illustrating a configuration of an optically pumped atomic magnetometer according to a fourth embodiment of the present invention.

FIG. 8 is a perspective view illustrating a schematic configuration of the optically pumped atomic magnetometer according to the present embodiment. FIG. 9 is a cross-sectional view of the optically pumped atomic magnetometer according to the present embodiment. FIG. 9 is a schematic cross-sectional view along a plane parallel to an x-z plane in the coordinate system of FIG. 8.

First, a schematic configuration of the optically pumped atomic magnetometer according to the present embodiment will be described with reference to FIGS. 8 and 9.

As illustrated in FIG. 8, an optically pumped atomic magnetometer 400 according to the present embodiment includes thermostatic heat insulation tanks 411 and 412 containing cells, pump beam optical systems 401 and 402, optical modulators 405 and 406, and mirrors 407 and 408.

Figure 9:
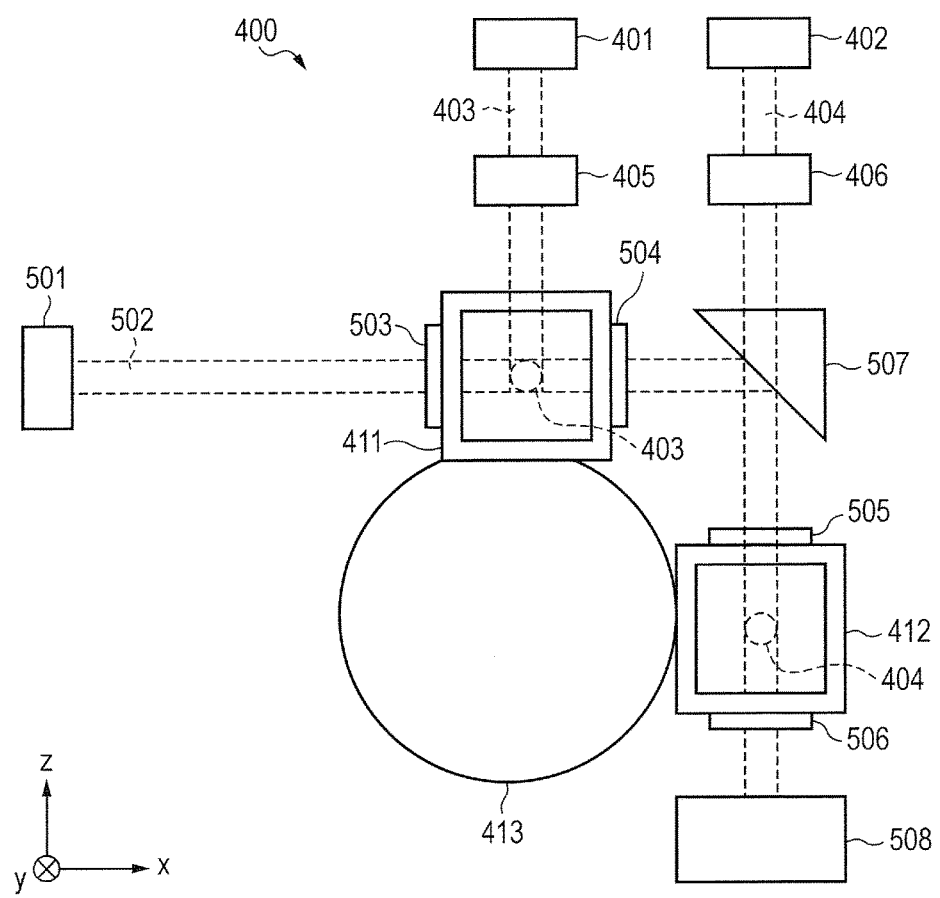
FIG. 9 is a cross-sectional view illustrating the configuration of the optically pumped atomic magnetometer according to the fourth embodiment of the present invention.

As illustrated in FIGS. 8 and 9, the optically pumped atomic magnetometer 400 also includes a probe beam optical system 501, a mirror 507 and a polarization measurement system 508. A sphere depicted adjacent to the thermostatic heat insulation tanks 411 and 412 in FIGS. 8 and 9 is a measurement object 413.

The optical system of the optically pumped atomic magnetometer 400 according to the present embodiment is arranged so that a probe beam 502 emitted from the probe beam optical system 501 and pump beams 403 and 404 emitted from the pump beam optical systems 401 and 402 propagate through optical paths illustrated below.

More specifically, the probe beam 502 emitted from the probe beam optical system 501 enters the thermostatic heat insulation tank 411 through an optical window 503 and propagates in the x direction in the thermostatic heat insulation tank 411. The probe beam 502 is then emitted from an optical window 504. The probe beam 502 emitted from the thermostatic heat insulation tank 411 is bent 90 degrees by the mirror 507 and enters the thermostatic heat insulation tank 412 through an optical window 505. The probe beam 502 propagates in the −z direction in the thermostatic heat insulation tank 412 and is then emitted from an optical window 506. The probe beam 502 emitted from the thermostatic heat insulation tank 412 enters the polarization measurement system 508.

The pump beam 403 emitted from the pump beam optical system 401 enters the thermostatic heat insulation tank 411 from an optical window 409 through the optical modulator 405 and the mirror 407 and propagates in the y direction in the thermostatic heat insulation tank 411. The probe beam 502 and the pump beam 403 intersect in the cell not illustrated that is arranged in the thermostatic heat insulation tank 411. The pump beam 404 emitted from the pump beam optical system 402 enters the thermostatic heat insulation tank 412 from an optical window 410 through the optical modulator 406 and the mirror 408 and propagates in the y direction in the thermostatic heat insulation tank 412. The probe beam 502 and the pump beam 404 intersect in the cell not illustrated that is arranged in the thermostatic heat insulation tank 412.

In this way, the probe beam 502 in the optically pumped atomic magnetometer according to the present embodiment propagates through the thermostatic heat insulation tank 411 in the x direction and further propagates through the thermostatic heat insulation tank 412 in the −z direction. An optical waveguide unit (including the mirror 507) that guides the probe beam 502 is provided between the thermostatic heat insulation tank 411 and the thermostatic heat insulation tank 412.

Differences from the embodiments described so far regarding the constituent parts of the optically pumped atomic magnetometer according to the present embodiment will be mainly and more specifically described. Parts not particularly described below are the same as in the embodiments described so far.

[1] Thermostatic Heat Insulation Tanks 411 and 412

The thermostatic heat insulation tanks 411 and 412 include cells (not illustrated) containing potassium. The thermostatic heat insulation tanks 411 and 412 include heating units that can heat the cells at a temperature of about 180° C. Bias magnetic field adjustment coils and inclination correction coils (not illustrated) as described in the second embodiment are arranged around the thermostatic heat insulation tanks 411 and 412.

To make uniform the signal response characteristics of the cells included in the thermostatic heat insulation tanks 411 and 412, the buffer gas pressures in the two cells are set to the same pressure as much as possible, or the pressure difference can be within 0.1 [amg]. The temperatures in the thermostatic heat insulation tanks 411 and 412 are also set to the same temperature as much as possible, or the temperature difference can be within 0.1° C.

Although two thermostatic heat insulation tanks 411 and 412 including cells are provided in FIGS. 8 and 9, the number of thermostatic heat insulation tanks including cells is not limited to two, and the number can be increased as necessary. The individual cells may not be arranged in separate thermostatic heat insulation tanks, and a plurality of cells may be arranged in a large common thermostatic heat insulation tank.

The arrangement of the plurality of thermostatic heat insulation tanks 411 and 412 can be appropriately changed according to the shape of the measurement object 413. For example, although the thermostatic heat insulation tanks 411 and 412 are arranged so that the optical path of the probe beam 502 passing through the thermostatic heat insulation tank 411 is orthogonal to the optical path of the probe beam 502 passing through the thermostatic heat insulation tank 412 in the example of FIGS. 8 and 9, the optical paths may not necessarily be orthogonal to each other.

[2] Pump Beam Optical System

In addition to the pump beam optical systems 401 and 402, the pump beam optical system includes the optical modulators 405 and 406 and the mirrors 407 and 408.

The pump beam optical systems 401 and 402 include frequency stabilization units that fix the wavelength of the emitted light to the D1 transition resonance wavelength of potassium, and linear polarizers that convert the polarized light of the emitted light into linearly polarized light.

The optical modulator 405 and the optical modulator 406 modulate the pump beam 403 emitted from the pump beam source 401 and the pump beam 404 emitted from the pump beam source 402 at different frequencies, respectively. An example of the modulation method includes the method described in the second embodiment. Alternatively, the optical modulators 405 and 406 can modulate the pump beams 403 and 404 at the same modulation frequency and different phases by the method described in the third embodiment.

The pump beams 403 and 404 that have passed through the optical modulators 405 and 406 are converted into circularly polarized lights by quarter wavelength plates not illustrated. The mirror 407 adjusts the optical path of the pump beam 403. The pump beam 403 passes through the optical window 409 to enter the thermostatic heat insulation tank 411, and the potassium atom group of the cell is polarized by the circularly polarized light components. The mirror 408 adjusts the optical path of the pump beam 404. The pump beam 404 passes through the optical window 410 to enter the thermostatic heat insulation tank 412, and the potassium atom group of the cell is polarized by the circularly polarized light components.

[3] Probe Beam Optical System

The probe beam optical system includes the probe beam source 501, the mirror 507 and the polarization measurement system 508.

The polarized light of the probe beam 502 emitted from the probe beam source 501 is linearly polarized light. The probe beam 502 transmits through the optical window 503 to enter the thermostatic heat insulation tank 411 and enters the cell inside of the thermostatic heat insulation tank 411. The potassium atom group in the cell applies Faraday rotation proportional to the measurement target magnetic field to the probe beam 502 entering the cell.

The mirror 507 guides the probe beam 502 emitted from the thermostatic heat insulation tank 411 through the optical window 504 to transmit through the optical window 505 to enter the thermostatic heat insulation tank 412 to enter the cell inside of the thermostatic heat insulation tank 412. The potassium atom group in the cell further applies Faraday rotation proportional to the measurement target magnetic field to the probe beam 502 entering the cell.

The optical waveguide unit between the thermostatic heat insulation tank 411 and the thermostatic heat insulation tank 412 may not be the mirror 507 as long as the probe beam 502 can be guided to enter the thermostatic heat insulation tank 412 from the optical window 505, while the polarization of the probe beam 502 is maintained. For example, instead of using the mirror 507, refraction by a prism and the like may be used to guide the probe beam 502, or an optical waveguide such as a polarization-maintaining optical fiber may be used to guide the probe beam 502.

The probe beam 502 transmitted through the cell in the thermostatic heat insulation tank 412 passes through the optical window 506 and enters the polarization measurement system 508. The polarization measurement system 508 can have, for example, the same configuration as the polarization measurement system described in the second or third embodiment. As a result, a magnetic signal of the intersection area of the probe beam 502 and the pump beam 403 and a magnetic signal of the intersection area of the probe beam 502 and the pump beam 404 can be extracted.

According to the present embodiment, the pump beams entering different locations of the cell are modulated differently. Therefore, the magnetic information in the different locations can be placed on the probe beam. As a result, the magnetic information of spatially different places can be separated and measured at the same time by one probe beam. A plurality of cells is used to measure the magnetic information of different locations, and the degree of freedom in setting the measurement location can be improved.

Fifth Embodiment

An optically pumped atomic magnetometer and a magnetic sensing method according to a fifth embodiment of the present invention will be described with reference to FIGS. 10A to 10E. The same constituent elements as in the optically pumped atomic magnetometer according to the first to fourth embodiments illustrated in FIGS. 1 to 9 are expressed by the same names, and the description will be omitted or simplified. The description of the same constituent elements in the embodiments can be applied to each other within a range not contrary to the configurations specific to the embodiments.

Figure 10A:
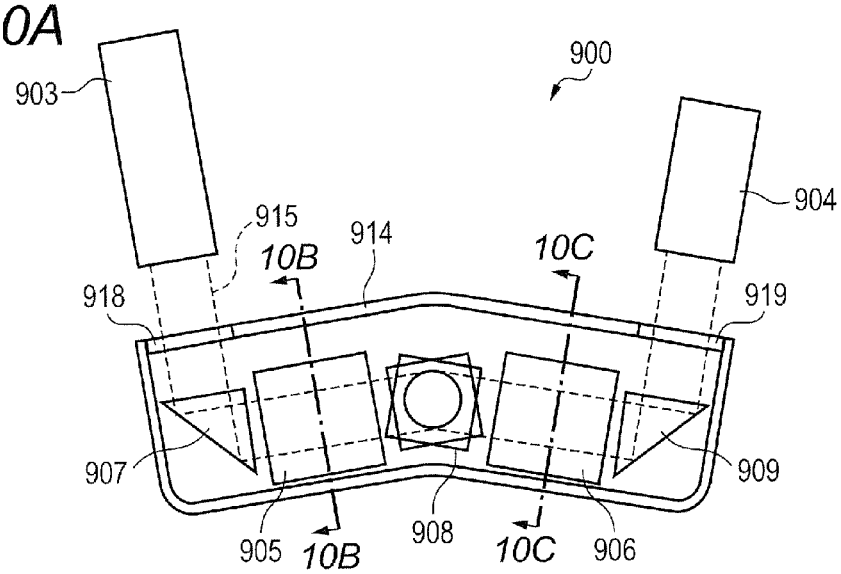
FIGS. 10A, 10B, 10C, 10D and 10E are schematic diagrams illustrating a configuration of an optically pumped atomic magnetometer according to a fifth embodiment of the present invention.
Figure 10B:
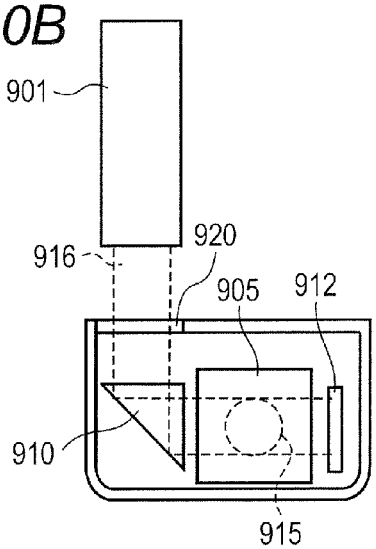
Figure 10C:
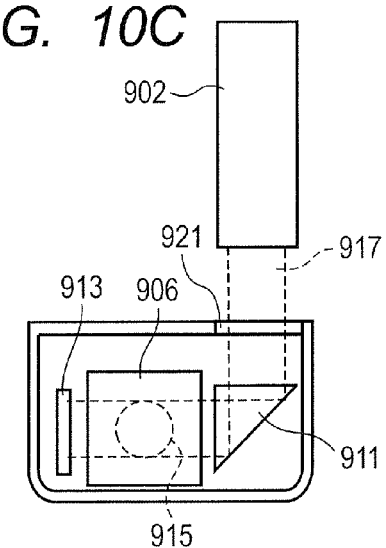
Figure 10D:
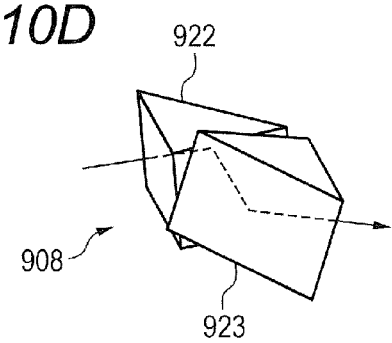
Figure 10E:
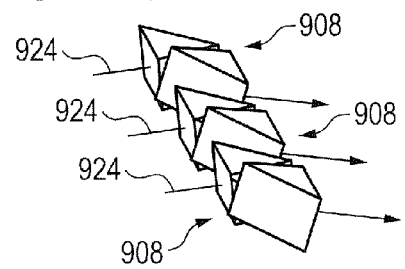

FIGS. 10A to 10E are diagrams illustrating a schematic configuration of the optically pumped atomic magnetometer according to the present embodiment. FIG. 10A is a cross-sectional view of a plane parallel to the optical path of the probe beam. FIGS. 10B and 10C are cross-sectional views of planes parallel to the optical paths of the pump beams, equivalent to a cross-sectional view of a line 10B-10B and a cross-sectional view of a line 10C-10C of FIG. 10A, respectively. FIGS. 10D and 10E are diagrams illustrating a schematic configuration of a composite prism mirror and a modified example of the schematic configuration.

First, a schematic configuration of the optically pumped atomic magnetometer according to the present embodiment will be described with reference to FIGS. 10A to 10E.

As illustrated in FIG. 10A, an optically pumped atomic magnetometer 900 according to the present embodiment includes a probe beam optical system 903, a thermostatic heat insulation tank 914, prism mirrors 907 and 909, a composite prism mirror 908, cells 905 and 906, and a polarimeter 904. As illustrated in FIG. 10B, the optically pumped atomic magnetometer 900 also includes a pump beam optical system 901, a prism mirror 910 and an optical terminator 912. As illustrated in FIG. 10C, the optically pumped atomic magnetometer 900 also includes a pump beam optical system 902, a prism mirror 911 and an optical terminator 913. The prism mirrors 907, 909, 910 and 911, the composite prism mirror 908, and the potassium metal cells 905 and 906 are arranged in the thermostatic heat insulation tank 914.

The optical system of the optically pumped atomic magnetometer according to the present embodiment is arranged so that a probe beam 915 emitted from the probe beam optical system 903 and pump beams 916 and 917 emitted from the pump beam optical systems 901 and 902 propagate through optical paths illustrated below.

In the present embodiment, the pump beam optical systems 901 and 902 are beam sources including optical modulators. As in the fourth embodiment, the intensity-modulated circularly polarized pump light beams 916 and 917 are emitted from the pump beam optical systems 901 and 902 as collimated lights in which the beam diameter is enlarged to about ½ of the cell size. As illustrated in FIG. 10B, the pump beam 916 enters the thermostatic heat insulation tank 914 through an optical window 920. The travelling direction of the pump beam 916 is bent 90 degrees by the prism mirror 910, and the pump beam 916 is introduced to the cell 905. The optical terminator 912 absorbs the pump beam 916 transmitted through the cell 905. Similarly, as illustrated in FIG. 10C, the pump beam 917 enters the thermostatic heat insulation tank 914 through an optical window 921. The travelling direction of the pump beam 917 is bent 90 degrees by the prism mirror 911, and the pump beam 917 is introduced to the cell 906. The optical terminator 913 absorbs the pump beam 917 transmitted through the cell 906.

The probe beam 915 is emitted from the probe beam optical system 903 as collimated light in which the beam diameter is enlarged to about ½ of the cell size. The probe beam 915 emitted from the probe beam optical system 903 enters the thermostatic heat insulation tank 914 through an optical window 918. The travelling direction of the probe beam 915 is bent 90 degrees by the prism mirror 907, and the probe beam 915 enters the cell 905. The probe beam 915 intersects with the pump beam 916 in the cell 905 and receives rotation of the plane of polarization according to the magnetic field.

The travelling direction of the probe beam 915 that has passed through the cell 905 is slightly bent by the composite prism mirror 908, and the probe beam 915 enters the cell 906. The probe beam 915 intersects with the pump beam 917 in the cell 906 and receives rotation of the plane of polarization according to the magnetic field.

The travelling direction of the probe beam 915 that has passed through the cell 906 is bent 90 degrees by the prism mirror 909. The probe beam 915 is emitted from the thermostatic heat insulation tank 914 through an optical window 919 and enters the polarimeter 904 that measures the rotation angle of the plane of polarization.

In this way, the optically pumped atomic magnetometer 900 of the present embodiment is an example in which the plurality of cells 905 and 906 are arranged in the common thermostatic heat insulation tank 914. This is also an embodiment of the optical system in which the composite prism mirror 908 is used to bend the travelling direction of the probe beam 915 little by little.

As illustrated in FIG. 10D, the composite prism mirror 908 is an element formed by combining two right-angle prisms 922 and 923. The right-angle prisms 922 and 923 come into contact with each other at one of the surfaces forming the right angle. The right-angle prisms 922 and 923 are rotated by an angle θ, with the normal line of the contact surface serving as the rotation axis. The angle θ is a rotation angle between the right-angle prisms 922 and 923, wherein the angle when the cross sections of isosceles right triangles of two right-angle prisms 922 and 923 are parallel to each other and are actually on the same plane is 0 degrees. As illustrated in FIG. 10E, arranging a plurality of composite prism mirrors 908 is useful as a compact optical system for bending the optical paths at a small angle when a large number of probe beams pass.

According to the present embodiment, the pump beams entering different locations of the cell are modulated differently. Therefore, the magnetic information in the different locations can be placed on the probe beam. As a result, the magnetic information of spatially different places can be separated and measured at the same time by one probe beam. A plurality of cells is arranged in one thermostatic heat insulation layer. Therefore, the temperatures between a plurality of cells can be easily approximated, and the measurement accuracy can be improved.

Sixth Embodiment

An optically pumped atomic magnetometer and a magnetic sensing method according to the sixth embodiment of the present invention will be described with reference to FIG. 11. The same constituent elements as in the optically pumped atomic magnetometer according to the first to fifth embodiments illustrated in FIGS. 1 to 10E are expressed by the same names, and the description will be omitted or simplified. The description of the same constituent elements in the embodiments can be applied to each other within a range not contrary to the configurations specific to the embodiments.

Figure 11:
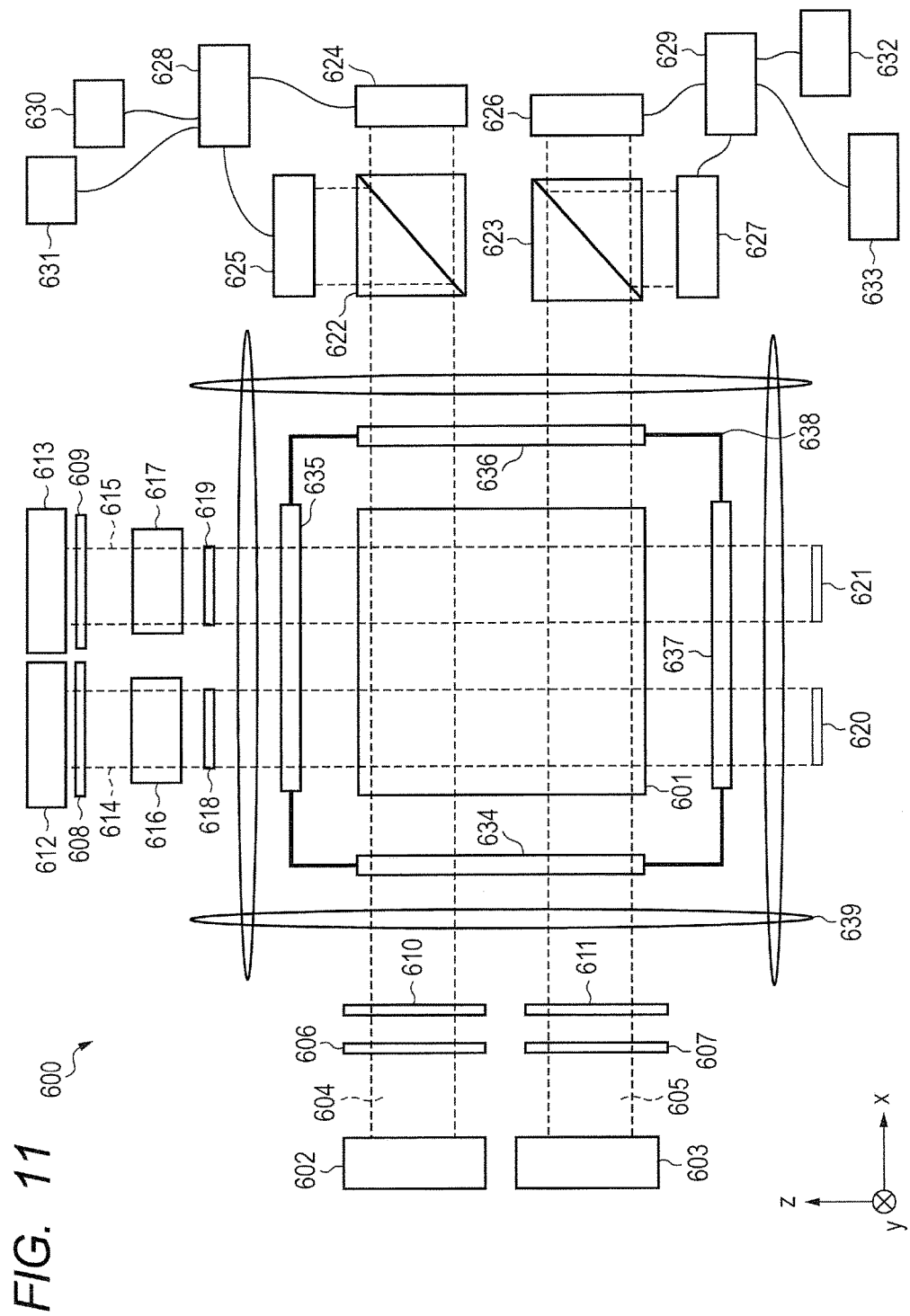
FIG. 11 is a schematic diagram illustrating a configuration of an optically pumped atomic magnetometer according to a sixth embodiment of the present invention.

FIG. 11 is a diagram illustrating a schematic configuration of the optically pumped atomic magnetometer according to the present embodiment.

As illustrated in FIG. 11, an optically pumped atomic magnetometer 600 according to the present embodiment includes a cell 601, a thermostatic heat insulation tank 638 and bias magnetic field adjustment coils 639. The optically pumped atomic magnetometer 600 also includes probe beam sources 602 and 603, linear polarizers 606 and 607, and half wavelength plates 610 and 611. The optically pumped atomic magnetometer 600 also includes pump beam sources 612 and 613, linearly polarized light elements 608 and 609, optical modulators 616 and 617, quarter wavelength plates 618 and 619, and optical terminators 620 and 621. The optically pumped atomic magnetometer 600 also includes polarization separation elements 622 and 623, photodetectors 624, 625, 626 and 627, difference circuits 628 and 629, and demodulators 630, 631, 632 and 633.

The cell 601 containing potassium and rubidium is arranged in the thermostatic heat insulation tank 638. Optical windows 634, 635, 636 and 637 for transmitting probe beams 604 and 605 and pump beams 614 and 615 to the thermostatic heat insulation tank 638 are provided on the surfaces of the walls of the thermostatic heat insulation tank 638. The bias magnetic field adjustment coils 639 are arranged around the thermostatic heat insulation tank 638.

The probe beam source 602 is configured to introduce the probe beam 604 to the cell 601 through the linear polarizer 606, the half wavelength plate 610 and the optical window 634. The probe beam 604 that has passed through the cell 601 enters the polarization separation element 622 through the optical window 636. This probe beam optical system is arranged so that the probe beam 604 propagates in the cell 601 in the x direction in the coordinate system illustrated in FIG. 11.

The probe beam source 603 is configured to introduce the probe beam 605 to the cell 601 through the linear polarizer 607, the half wavelength plate 611 and the optical window 634. The probe beam 605 that has passed through the cell 601 enters the polarization separation element 623 through the optical window 636. This probe beam optical system is arranged so that the probe beam 605 propagates in the cell 601 in the x direction in the coordinate system illustrated in FIG. 11.

The pump beam source 612 is configured to introduce the pump beam 614 to the cell 601 through the linear polarizer 608, the optical modulator 616, the quarter wavelength plate 618 and the optical window 635. The pump beam 614 that has passed through the cell 601 enters the optical terminator 620 through the optical window 637. This pump beam optical system is arranged so that the pump beam 614 propagates in the cell 601 in the −z direction in the coordinate system illustrated in FIG. 11. As a result, the pump beam 614 intersects with the probe beams 604 and 605 at different locations in the cell 610.

The pump beam source 613 is configured to introduce the pump beam 615 to the cell 601 through the linear polarizer 609, the optical modulator 617, the quarter wavelength plate 619 and the optical window 635. The pump beam 615 that has passed through the cell 601 enters the optical terminator 621 through the optical window 637. This pump beam optical system is arranged so that the pump beam 615 propagates in the cell 601 in the −z direction in the coordinate system illustrated in FIG. 11. As a result, the pump beam 615 intersects with the probe beams 604 and 605 at different locations in the cell 610.

The polarization separation element 622 divides the probe beam 604 entering the polarization separation element 622 into reflected beam and transmitted beam based on the intensity according to the angle of the plane of polarization of the probe beam 604. The transmitted beam of the polarization separation element 622 enters the photodetector 624, and the reflected beam of the polarization separation element 622 enters the photodetector 625. The demodulators 630 and 631 are connected to the photodetectors 624 and 625 through the difference circuit 628.

The polarization separation element 623 divides the probe beam 605 entering the polarization separation element 623 into reflected beam and transmitted beam based on the intensity according to the angle of the plane of polarization of the probe beam 605. The transmitted beam of the polarization separation element 623 enters the photodetector 626, and the reflected beam of the polarization separation element 623 enters the photodetector 627. The demodulators 632 and 633 are connected to the photodetectors 626 and 627 through the difference circuit 629.

Differences from the embodiments described so far regarding the constituent parts of the optically pumped atomic magnetometer according to the present embodiment will be mainly and more specifically described. Parts not particularly described below are the same as in the embodiments described so far.

[1] Cell 601

The cell 601 is an airtight structure made of a material, such as glass, transparent to the probe beam and the pump beam. Potassium and rubidium as alkali metal atoms are enclosed in the cell 601 to spatially make uniform the spin polarization of the pump beam in the travelling direction. Other examples of the combination of alkali metal atoms that can be used include a combination of potassium and cesium and a combination of rubidium and cesium. However, the combination of isotopes in which the size of the gyromagnetic ratio is the same, i.e. nuclear spin I is the same, is only a combination of $^{39}$K and $^{87}$Rb, where I=3/2. The scattering cross section of potassium atoms with respect to spin polarization destruction caused by collision of the atoms and collision with helium atoms is the smallest among the alkali metal atoms. The scattering cross section of rubidium atoms is the smallest after the potassium atoms. Therefore, the combination of potassium and rubidium can be the best combination of alkali metal atoms.

Since the vapor pressure of rubidium is higher than that of potassium at the same temperature, the enclosed amount of rubidium in the cell 601 is reduced. In addition, a helium gas and a nitrogen gas are enclosed in the cell 601 as a buffer gas and a quencher gas.

[2] Pump Beam Optical System

As illustrated in FIG. 11, the pump beam optical system includes the pump beam sources 612 and 613, the linear polarizers 608 and 609, the optical modulators 616 and 617, the quarter wavelength plates 618 and 619, and the optical terminators 620 and 621.

The pump beam source 612 includes a frequency stabilization unit that fixes the light wavelength of the pump beam 614 to the D1 transition resonance wavelength (794.7 nm) of rubidium atoms. The pump beam source 613 includes a frequency stabilization unit that fixes the light wavelength of the pump beam 615 to the D1 transition resonance wavelength (794.7 nm) of rubidium atoms. Beam from the same beam source may be divided into two and used as the pump beams 614 and 615. The linear polarizers 608 and 609 polarize the pump beams 614 and 615, respectively, to form linearly polarized lights. The optical modulators 616 and 617 modulate the beams, and the quarter wavelength plates 618 and 619 convert the beams into circularly polarized lights. The circularly polarized pump light beams 614 and 615 enter the cell 601 through the optical window 635 and spin-polarize the rubidium atoms in the cell 601.

When the spin-polarized rubidium atoms collide with the potassium atoms, spin exchange interaction occurs, and the spin polarization is applied to the potassium atoms. Therefore, polarizing the rubidium atoms can also polarize the potassium atoms. The wavelength difference between the D1 transition resonance wavelength of the rubidium atoms and the D1 transition resonance wavelength (770.1 nm) as well as the D2 transition resonance wavelength (766.7 nm) of the potassium atoms is sufficiently greater than the absorption line width (up to 10 GHz) in the presence of the buffer gas. Therefore, the potassium atoms hardly absorb the pump beams 614 and 615.

When the rubidium atoms are polarized, the circularly-polarized pump light beams 614 and 615 are not absorbed. Therefore, when the polarization rate of the rubidium atom group increases, the absorptance of the pump beams 614 and 615 decreases. As a result, if the intensity of the pump beams 614 and 615 is sufficiently large, there is no attenuation even when the rubidium atoms in the area of intersection with the probe beam 604 are spin-polarized. The rubidium atoms of the area of intersection with the probe beam 605 can be sufficiently spin-polarized.

The atom density of the rubidium atoms can be smaller than the atom density of the potassium atoms to make the spin polarization rate of the potassium atom group smaller than the spin polarization rate of the rubidium atom group. More specifically, the spin polarization rate of the potassium atoms caused by the spin exchange collision received from the rubidium atoms is smaller than the spin polarization rate of the rubidium atom group even if the rubidium atom group is completely spin-polarized. Therefore, the spin polarization rate of the potassium atoms can be reduced to near the polarization rate (up to 0.5) that maximizes the magnetic field sensitivity.

The pump beams 614 and 615 that have transmitted through the cell 601 are emitted from the thermostatic heat insulation tank 638 through the optical window 637, and the optical terminators 620 and 621 execute the termination process.

[3] Probe Beam Optical System

The probe beam optical system includes the probe beam sources 602 and 603, the linear polarizers 606 and 607, and the half wavelength plates 610 and 611.

The wavelength of the probe beam 604 emitted from the probe beam source 602 and the light wavelength of the probe beam 605 emitted from the probe beam source 603 are detuned about several GHz from the D1 transition resonance of the potassium atoms to maximize the signal response. The value of detuning for maximizing the signal response depends on the buffer gas pressure and the temperature of the cell 601. The probe beam sources 602 and 603 may include stabilization units, such as external resonators, to stabilize the light wavelength. The linear polarizers 606 and 607 convert the probe beams 604 and 605 into linearly polarized lights.

The probe beams 604 and 605 pass through the optical window 634 and enter the cell 601. The light wavelengths of the probe beams 604 and 605 detuned about several GHz from the D1 transition resonance wavelength of the potassium atoms are sufficiently separate from the D1 transition resonance wavelength and the D2 transition resonance wavelength of the rubidium atoms. Therefore, the probe beams 604 and 605 are not absorbed by the rubidium atoms or subjected to Faraday interaction. Faraday rotation of the planes of polarization of the probe beams 604 and 605 occurs, in proportion to the size of the x components in the spin polarization of the potassium atoms rotated by the measurement target magnetic field. The probe beams 604 and 605 transmitted through the cell 601 pass through the optical window 636. The probe beams 604 and 605 enter the polarization separation elements 622 and 623, and the polarization is measured.

The combination of the light wavelengths of the pump beams 614 and 615 and the light wavelengths of the probe beams 604 and 605 is not limited to the one described above. For example, the light wavelengths of the pump beams 614 and 615 can be adjusted to the D1 transition resonance wavelength of potassium, and the light wavelengths of the probe beams 604 and 605 can be detuned about several GHz from the D1 transition resonance wavelength of rubidium to maximize the signal response.

[4] Bias Magnetic Field Adjustment Coils 639

As illustrated in FIG. 11, the bias magnetic field adjustment coils 639 are arranged around the thermostatic heat insulation tank 638. The bias magnetic field adjustment coils 639 are installed in a magnetic shield not illustrated. The magnetic shield reduces the magnetic field entering from the external environment.

The bias magnetic field adjustment coils 639 are used to operate the magnetic field environments of four parts in total, which are the intersection areas of the probe beams 604 and 605 and the pump beams 614 and 615. The magnetic field environments can be the same magnetic field environment as much as possible in the measurement areas of four parts. Therefore, shim coils can be further added to correct the inhomogeneity of the magnetic fields.

The cell 601, the thermostatic heat insulation tank 638 and the bias magnetic field adjustment coils 639 may not be single ones, and one of each may be arranged for each intersection area.

[5] Polarization Measurement System

As illustrated in FIG. 11, the polarization measurement system includes the polarization separation elements 623 and 625, the photodetectors 624, 625, 626 and 627, the difference circuits 628 and 629, and the demodulators 630, 631, 632 and 633. Among these, the polarization measurement system for measuring the polarization of the probe beam 604 includes the polarization separation element 622, the photodetectors 624 and 625, the difference circuit 628, and the demodulators 630 and 631. The polarization measurement system for measuring the polarization of the probe beam 605 includes the polarization separation element 623, the photodetectors 626 and 627, the difference circuit 629, and the demodulators 632 and 633.

The demodulator 630 performs demodulation at the same frequency as the modulation frequency in the optical modulator 616, and the magnetic signal of the intersection area of the probe beam 604 and the pump beam 614 can be extracted. The demodulator 631 performs demodulation at the same frequency as the modulation frequency in the optical modulator 617, and the magnetic signal of the intersection area of the probe beam 604 and the pump beam 615 can be extracted. The demodulator 632 performs demodulation at the same frequency as the modulation frequency in the optical modulator 616, and the magnetic signal of the intersection area of the probe beam 605 and the pump beam 614 can be extracted. The demodulator 633 performs demodulation at the same frequency as the modulation frequency in the optical modulator 617, and the magnetic signal of the intersection area of the probe beam 605 and the pump beam 615 can be extracted. Therefore, the optically pumped atomic magnetometer 600 according to the present embodiment can measure magnetic field distributions of four points on the x-z plane of y direction components $B_y$ of the measurement target magnetic field in the coordinate system illustrated in FIG. 11.

In the example described in the present embodiment, the D1 transition resonance wavelength of rubidium is used as the light wavelength of the pump beam, and the D1 transition resonance wavelength of potassium is used as the light wavelength of the probe beam. However, the D1 transition resonance wavelength of potassium can be used as the light wavelength of the pump beam, and the D1 transition resonance wavelength of rubidium can be used as the light wavelength of the probe beam in such a hybrid cell. As written in the description related to the cell, using a cell with an enclosed amount in which the density of potassium is higher than the density of rubidium at the working temperature is effective in forming a sensor with high sensitivity in this case.

According to the present embodiment, the pump beams entering different locations of the cell are modulated differently. Therefore, the magnetic information in the different locations can be placed on the probe beam. As a result, the magnetic information of spatially different places can be separated and measured at the same time by one probe beam. A plurality of probe beams and a plurality of pump beams are used, and the magnetic information can be separated and measured at the same time in each intersection of the probe beams and the pump beams.

Seventh Embodiment

An optically pumped atomic magnetometer and a magnetic sensing method according to the seventh embodiment of the present invention will be described with reference to FIG. 12. The same constituent elements as in the optically pumped atomic magnetometer according to the first to sixth embodiments illustrated in FIGS. 1 to 11 are expressed by the same names, and the description will be omitted or simplified. The description of the same constituent elements in the embodiments can be applied to each other within a range not contrary to the configurations specific to the embodiments.

Figure 12:
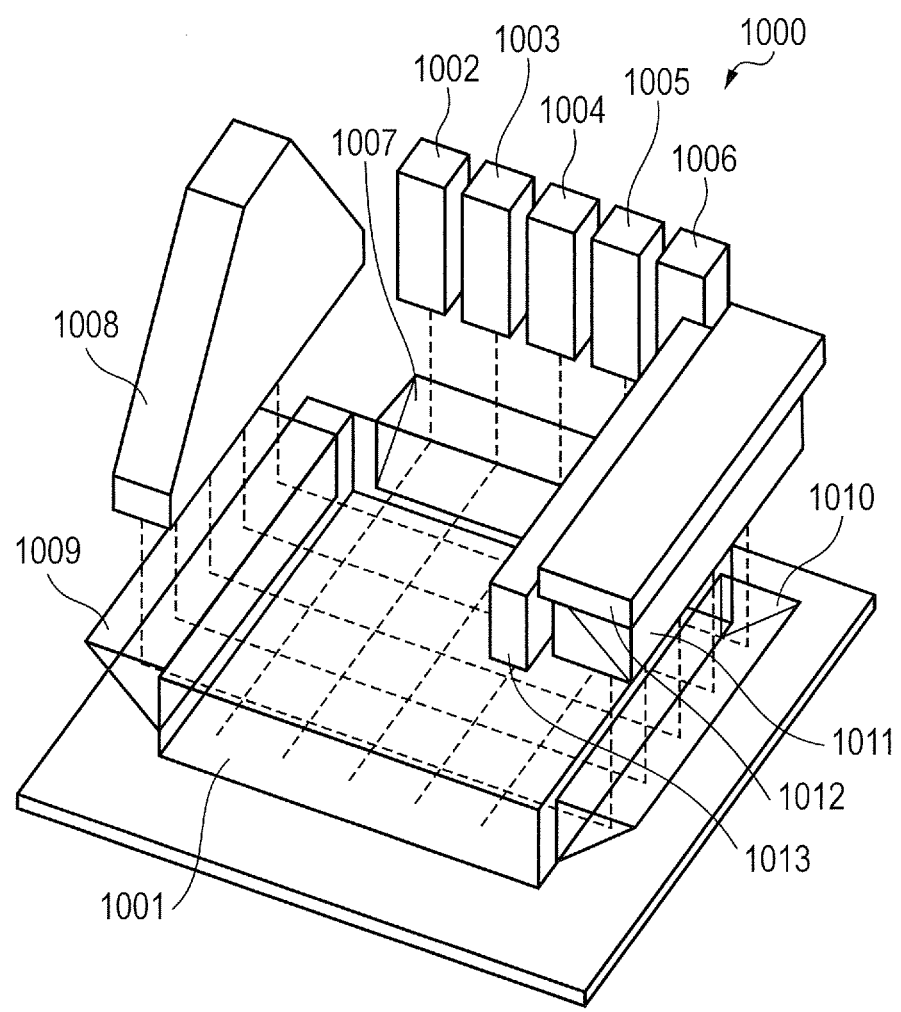
FIG. 12 is a schematic diagram illustrating a configuration of an optically pumped atomic magnetometer according to a seventh embodiment of the present invention.

FIG. 12 is a diagram illustrating a schematic configuration of the optically pumped atomic magnetometer according to the present embodiment.

As illustrated in FIG. 12, an optically pumped atomic magnetometer 1000 according to the present embodiment includes a cell 1001, pump beam optical systems 1002, 1003, 1004, 1005 and 1006, a probe beam optical system 1008, and prism mirrors 1007, 1009 and 1010. The optically pumped atomic magnetometer 1000 also includes a polarization beam splitter 1011 and photodetector arrays 1012 and 1013.

The optically pumped atomic magnetometer 1000 according to the present embodiment is configured to read magnetic fields of five parts per probe beam in the optically pumped atomic magnetometer according to the sixth embodiment. Although the number of pump beams is five in the example illustrated in the present embodiment, the number of pump beams is not limited to this.

The optical paths of the pump beams emitted from the pump beam optical systems 1002, 1003, 1004, 1005 and 1006 are bent 90 degrees by the prism mirror 1007, and the pump beams enter the glass cell 1001. The pump beam optical systems 1002, 1003, 1004, 1005 and 1006 enlarge the spot sizes of the lights introduced from optical fibers not illustrated to form collimated lights and adjust the polarization state to convert the lights bent by the prism mirror 1007 into circularly polarized lights. The lights introduced to the pump beam optical systems 1002, 1003, 1004, 1005 and 1006 are introduced through the optical fibers after intensity modulation by modulators not illustrated in each channel. Therefore, the lights emitted from the optical systems of the pump beam optical systems 1002, 1003, 1004, 1005 and 1006 are lights in which the intensity is modulated by the frequency of each channel.

The optical path of the probe beam emitted from the probe beam optical system 1008 is bent 90 degrees by the prism mirror 1009, and the probe beam enters the glass cell 1001. The probe beam optical system 1008 flatly enlarges the spot size of the beam introduced from an optical fiber not illustrated to form collimated light and adjusts the polarization state to convert the light bent by the prism mirror 1009 into linearly polarized light. The probe beam intersects with the pump beams in the cell 1001, and the probe beam is emitted from the cell 1001. The optical path of the probe beam emitted from the cell 1001 is bent 90 degrees by the prism mirror 1010, and the probe beam enters the polarization beam splitter 1011. The probe beam that has entered the polarization beam splitter 1011 is polarized and separated by the polarization beam splitter 1011, and the photodetector arrays 1012 and 1013 receive the probe beam. The difference between signal outputs from the photodetectors 1012 and 1013 at locations corresponding to the same probe beam is obtained to form a balanced polarimeter of each probe beam.

The probe beam is substantially individual beams even if the probe beam is a spatially continuous beam that is flat and wide, because only the parts reaching the light receiving portions of the light receiving elements of the photodetector arrays 1012 and 1013 are cut out. Optical apertures may be arranged in advance in the probe beam optical system 1008 to form individual beams to emit a plurality of beams. FIG. 12 illustrates a case of five probe beams emitted in this way.

To adjust the balance location of the balanced polarimeter formed by the polarization beam splitter 1011 and the photodetector arrays 1012 and 1013, adjusting the plane of polarization of the linearly polarized probe light beam is effective. The phase plate for this (typically, half wavelength plate) may be arranged in the probe beam optical system 1008 or may be provided just in front of the polarization beam splitter 1011.

Using a cell containing both of rubidium and potassium is desirable to generate uniform magnetic field response in the entire cell. This is because using the D1 transition resonance wavelength of rubidium as the light wavelength of the pump beam and using the D1 transition resonance wavelength of potassium as the light wavelength of the probe beam can generate high spin polarization of rubidium and appropriate (vicinity of spin polarization rate of up to 0.5 corresponds to maximum magnetic field response) spin polarization of potassium throughout the entire cell.

According to the present embodiment, the pump beams entering different locations of the cell are modulated differently. Therefore, the magnetic information in the different locations can be placed on the probe beam. As a result, the magnetic information of spatially different places can be separated and measured at the same time by one probe beam. Using spatially continuous probe beam that is flat and wide substantially including a plurality of probe beams and using a plurality of pump beams can separate and measure the magnetic information at the same time in the intersections of the probe beams and the pump beams.

Eighth Embodiment

An optically pumped atomic magnetometer according to the eighth embodiment of the present invention will be described with reference to FIGS. 13A to 13D. The same constituent elements as in the optically pumped atomic magnetometer according to the first to seventh embodiments illustrated in FIGS. 1 to 12 are expressed by the same names, and the description will be omitted or simplified. The description of the same constituent elements in the embodiments can be applied to each other within a range not contrary to the configurations specific to the embodiments.

FIGS. 13A to 13D are diagrams illustrating a schematic configuration of the optically pumped atomic magnetometer according to the present embodiment.

As illustrated in FIG. 13A, an optically pumped atomic magnetometer 700 according to the present embodiment includes a sensor head 738 including an oven 701 that heats a cell, a heat insulation lid 712 of the oven 701 in which the inside of an optical glass cell is evacuated and sealed, and an optical system holding unit 702.

Pump beam optical systems 703, 704, 705 and 706 are arranged in the optical system holding unit 702. One end of each of the pump beam optical systems 703, 704, 705 and 706 includes a connector (not illustrated) of polarization-maintaining optical fiber. The pump beam optical systems 703, 704, 705 and 706 collimate laser beam emitted from the optical fiber ends by lenses and emit circularly polarized collimation beams through half wavelength plates, linear polarizers and quarter wavelength plates.

A probe beam optical system 707 is also arranged in the optical system holding unit 702. One end of the probe beam optical system 707 includes a connector (not illustrated) of polarization-maintaining optical fiber. The probe beam optical system 707 collimates laser beam emitted from the optical fiber end by a lens and emits a linearly polarized collimation beam through a half wavelength plate, a linear polarizer and a half wavelength plate.

The optical system holding unit 702 is further provided with a balanced polarimeter including a lens unit 708 including a half wavelength plate and a lens, a polarization beam splitter 709, a mirror 710, and photodetectors 711.

In the oven 701, a measurement optical system as illustrated in FIG. 13C is arranged on an oven substrate 722. The measurement optical system includes cells 730 containing alkali metal, prism mirrors 728 for bending the pump beam, and prism mirrors 729 for bending the probe beam. Although not illustrated, a heater that heats the oven 701 and a temperature monitor for controlling the temperature in the oven 701 are also arranged in the oven 701.

As illustrated in FIG. 13B, the prism mirrors 728 bend the optical paths of the pump beams 723, 724, 725 and 726 emitted from the pump beam optical systems 703, 704, 705 and 706, and the pump beams 723, 724, 725 and 726 enter the cells 730. The prism mirrors 729 sequentially bend the optical path of a probe beam 727 emitted from the probe beam optical system 707, and the probe beam 727 passes through two cells 730 in the process. As a result, the probe beam 727 passing through the two cells 730 sequentially intersects with the pump beams 723, 724, 725 and 726 in the cells 730. Subsequently, the probe beam 727 enters the photodetectors 711 through the lens unit 708, the polarization beam splitter 709 and the mirror 710.

As illustrated in FIG. 13D, the sensor head 738 with the configuration is arranged in a magnetic shield 739 and bias magnetic field adjustment coils (not illustrated) and is used for magnetic field measurement.

As illustrated in FIG. 13D, beam from a pump beam source 733 is introduced to the pump beam optical systems 703, 704, 705 and 706 through electrooptical modulators 734, 735, 736 and 737. More specifically, an optical coupler divides the beam from the pump beam source 733 into four through polarization-maintaining optical fibers, and the beam enters the electrooptical modulators 734, 735, 736 and 737. The beam emitted from the electrooptical modulators 734, 735, 736 and 737 is introduced to the pump beam optical systems 703, 704, 705 and 706 through polarization-maintaining optical fibers. Beam from a probe beam source 732 is introduced to the probe beam optical system 707 through a polarization-maintaining optical fiber. As for the output signal from the sensor head 738, a detection circuit 731 including a transimpedance amplifier and a differential amplifier reads current signals from two photodetectors of the balanced polarimeter.

The method of modulation using modulation frequencies or modulation of extracting, as digital data, signals of predetermined bandwidths around the modulation frequencies can be performed in the same way as in the embodiments described above.

According to the present embodiment, the pump beams entering different locations of the cell are modulated differently. Therefore, the magnetic information in the different locations can be placed on the probe beam. As a result, the magnetic information of spatially different places can be separated and measured at the same time by one probe beam. Since the beam source, the modulator and the electrical signal processing unit are separated from the sensor head, the sensor head can be downsized.

Modified Example

The present invention is not limited to the embodiments, and various modifications can be made.

The embodiments just illustrate several modes of the present invention, and various corrections and modifications can be appropriately made without departing from the scope of the present invention.

According to the present invention, magnetic information of spatially different places can be separated and measured at the same time by one probe beam.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-175881, filed Aug. 29, 2014, which is hereby incorporated by reference herein in its entirety.

What is claimed is:

1. An optically pumped atomic magnetometer comprising:
   one or a plurality of cells containing alkali metal atoms;
   a pump beam optical system that introduces a plurality of pump beams including a circularly polarized light component to different locations of the one or a plurality of cells;
   a probe beam optical system that introduces a probe beam including a linearly polarized light component to the cell so that the probe beam intersects with the plurality of pump beams entering the one or a plurality of cells at the different locations;
   a detection unit that detects a signal reflecting a rotation angle of a plane of polarization of the probe beam after intersecting with the plurality of pump beams; and
   an information acquisition unit that acquires information related to a magnetic field intensity of each of the different locations from the signal detected by the detection unit,
   wherein the pump beam optical system comprises a modulation unit that modulates at least one of the plurality of pump beams so that at least one of frequencies and phases of the plurality of pump beams that is introduced to the different locations are different with each other.

2. The optically pumped atomic magnetometer according to claim 1, wherein the modulation unit modulates at least one of intensities, circular polarization degrees and light wavelengths of the plurality of pump beams entering the different locations.

3. The optically pumped atomic magnetometer according to claim 1, wherein the information acquisition unit comprises a demodulation unit that demodulates the signal at the same frequency as a modulation frequency used by the modulation unit.

4. The optically pumped atomic magnetometer according to claim 1, wherein the alkali metal atoms are at least one type of atoms selected from the group consisting of potassium, rubidium and cesium.

5. The optically pumped atomic magnetometer according to claim 1, wherein the alkali metal atoms include potassium and rubidium.

6. The optically pumped atomic magnetometer according to claim 1, wherein the modulation frequency of the modulation unit is not less than 10 Hz.

7. The optically pumped atomic magnetometer according to claim 6, wherein the modulation frequency of the modulation unit is not less than 1 kHz.

8. The optically pumped atomic magnetometer according to claim 1, wherein the probe beam optical system introduces a plurality of the probe beams to the cell so that the probe beams intersect with the plurality of pump beams at different locations.

9. The optically pumped atomic magnetometer according to claim 1, comprising a plurality of the cells,
   wherein the pump beam optical system introduces at least one of the plurality of pump beams to each of the plurality of cells, and
   the probe beam intersects with the pump beam in each of the plurality of cells.

10. The optically pumped atomic magnetometer according to claim 9, further comprising an optical waveguide unit that guides the probe beam to between the plurality of cells.

11. The optically pumped atomic magnetometer according to claim 1, further comprising:
    a sensor head comprising the cell and the detection unit;
    a first optical waveguide unit that guides the plurality of modulated pump beams output from the pump beam optical system to the sensor head; and
    a second optical waveguide unit that guides the probe beam output from the probe beam optical system to the sensor head.

12. The optically pumped atomic magnetometer according to claim 1, wherein the plurality of pump beams entering the different locations are modulated at different phases.

13. An optically pumped atomic magnetometer comprising:
    at least one cell containing alkali metal atoms;
    a pump beam optical system that introduces a pump beam including a circularly polarized light component to the cell;
    a probe beam optical system that introduces a probe beam including a linearly polarized light component to the cell so that the probe beam intersects with the pump beam at a plurality of different locations in the cell;
    a detection unit that detects the probe beam intersecting with the pump beam at the different locations to output a detection signal;
    an information acquisition unit that acquires information related to a magnetic field intensity of each of the different locations from the detection signal; and
    a modulation unit that modulates spin polarization rates of the alkali metal atoms at the different locations so that at least one of time-varying periods and phases of the spin polarization rates of the alkali metal atoms at the different locations are different with each other.

14. A magnetic sensing method comprising:
- inputting a plurality of pump beams including a circularly polarized light component to different locations of a cell containing alkali metal atoms;
- introducing a probe beam including a linearly polarized light component to the cell so that the probe beam intersects with the pump beams at the different locations;
- detecting a signal reflecting a rotation angle of a plane of polarization of the probe beam passing through the cell;
- calculating information related to a magnetic field intensity at each of the different locations from the detected signal; and
- modulating at least one of the plurality of pump beams so that at least one of frequencies and phases of the plurality of pump beams that is introduced to the different locations are different with each other.

* * * * *